(12) United States Patent
Chen et al.

(10) Patent No.: US 10,141,321 B2
(45) Date of Patent: Nov. 27, 2018

(54) METHOD OF FORMING FLASH MEMORY WITH SEPARATE WORDLINE AND ERASE GATES

(71) Applicant: Silicon Storage Technology, Inc., San Jose, CA (US)

(72) Inventors: Chun-Ming Chen, New Taipei (TW); Man-Tang Wu, Hsinchu County (TW); Jeng-Wei Yang, Hsinchu County (TW); Chien-Sheng Su, Saratoga, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/290,960

(22) Filed: Oct. 11, 2016

(65) Prior Publication Data

US 2017/0117285 A1   Apr. 27, 2017

Related U.S. Application Data

(60) Provisional application No. 62/244,688, filed on Oct. 21, 2015.

(51) Int. Cl.
| | |
|---|---|
| *H01L 27/115* | (2017.01) |
| *H01L 29/66* | (2006.01) |
| *H01L 29/788* | (2006.01) |
| *H01L 27/11521* | (2017.01) |
| *H01L 21/28* | (2006.01) |
| *H01L 29/423* | (2006.01) |
| *G11C 16/04* | (2006.01) |

(52) U.S. Cl.
CPC .. *H01L 27/11521* (2013.01); *H01L 21/28273* (2013.01); *H01L 29/42328* (2013.01); *H01L 29/66825* (2013.01); *H01L 29/788* (2013.01); *G11C 16/0408* (2013.01)

(58) Field of Classification Search
CPC .......... G11C 16/0408; H01L 21/28273; H01L 27/11521; H01L 29/788; H01L 29/66825; H01L 29/7882; H01L 29/42328
See application file for complete search history.

(56) References Cited

U.S. PATENT DOCUMENTS

| | | |
|---|---|---|
| 5,029,130 A | 7/1991 | Yeh |
| 7,868,375 B2 | 1/2011 | Liu et al. |
| 9,123,822 B2 | 9/2015 | Yoo et al. |
| 9,245,638 B2 | 1/2016 | Do et al. |
| 2004/0065917 A1 | 4/2004 | Fan et al. |

(Continued)

*Primary Examiner* — Caridad Everhart
(74) *Attorney, Agent, or Firm* — DLA Piper LLP (US)

(57) ABSTRACT

A method of forming a non-volatile memory cell includes forming spaced apart first and second regions in a substrate, defining a channel region there between. A floating gate is formed over a first portion of the channel region and over a portion of the first region, wherein the floating gate includes a sharp edge disposed over the first region. A tunnel oxide layer is formed around the sharp edge. An erase gate is formed over the first region, wherein the erase gate includes a notch facing the sharp edge, and wherein the notch is insulated from the sharp edge by the tunnel oxide layer. A word line gate is formed over a second portion of the channel region which is adjacent to the second region. The forming of the word line gate is performed after the forming of the tunnel oxide layer and the erase gate.

15 Claims, 28 Drawing Sheets

(56) References Cited

U.S. PATENT DOCUMENTS

| | | | |
|---|---|---|---|
| 2005/0012137 A1* | 1/2005 | Levi | H01L 27/115 |
| | | | 257/315 |
| 2005/0024961 A1 | 2/2005 | Ding | |
| 2013/0154022 A1 | 6/2013 | Chung et al. | |
| 2015/0187784 A1* | 7/2015 | Tan | H01L 27/11551 |
| | | | 257/321 |
| 2015/0270273 A1* | 9/2015 | Ma | H01L 27/11548 |
| | | | 257/316 |

* cited by examiner

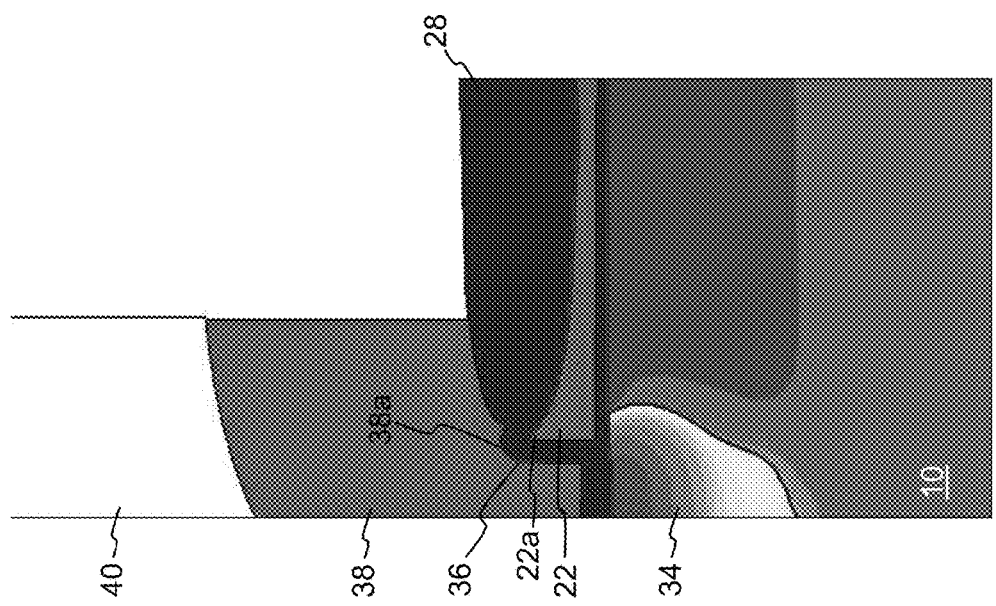
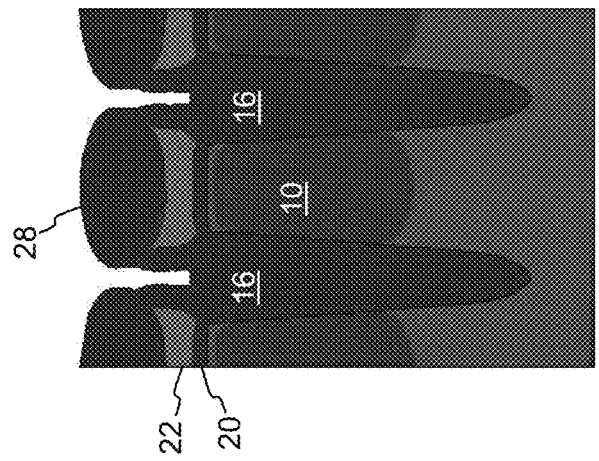
FIG. 10A
FIG. 10B

|  | Word-line (48) | | Bit-line (60) | | Erase Gate (38) | | Source-line (34) | | Time |
|---|---|---|---|---|---|---|---|---|---|
|  | Sel. | Uns. | Sel. | Uns. | Sel. | Uns. | Sel. | Uns. | |
| Read | 1.05V (Vgr) | 0V | 0.8V (Vdr) | 0V | 2.5V | 0V | 0V | 0V | |
| Erase | 0V | 0V | 0V | 0V | 11.0V | 0V | 0V | 0V | 10ms (Ters) |
| Program | 1.0V (Vgp) | 0V | 1-2.5µA (Idp) | Vdd (Vinh) | 2.5-6.5V | 0V | 9.0-6.0V | 0V | 10µs (Tpgm) |

FIG. 21

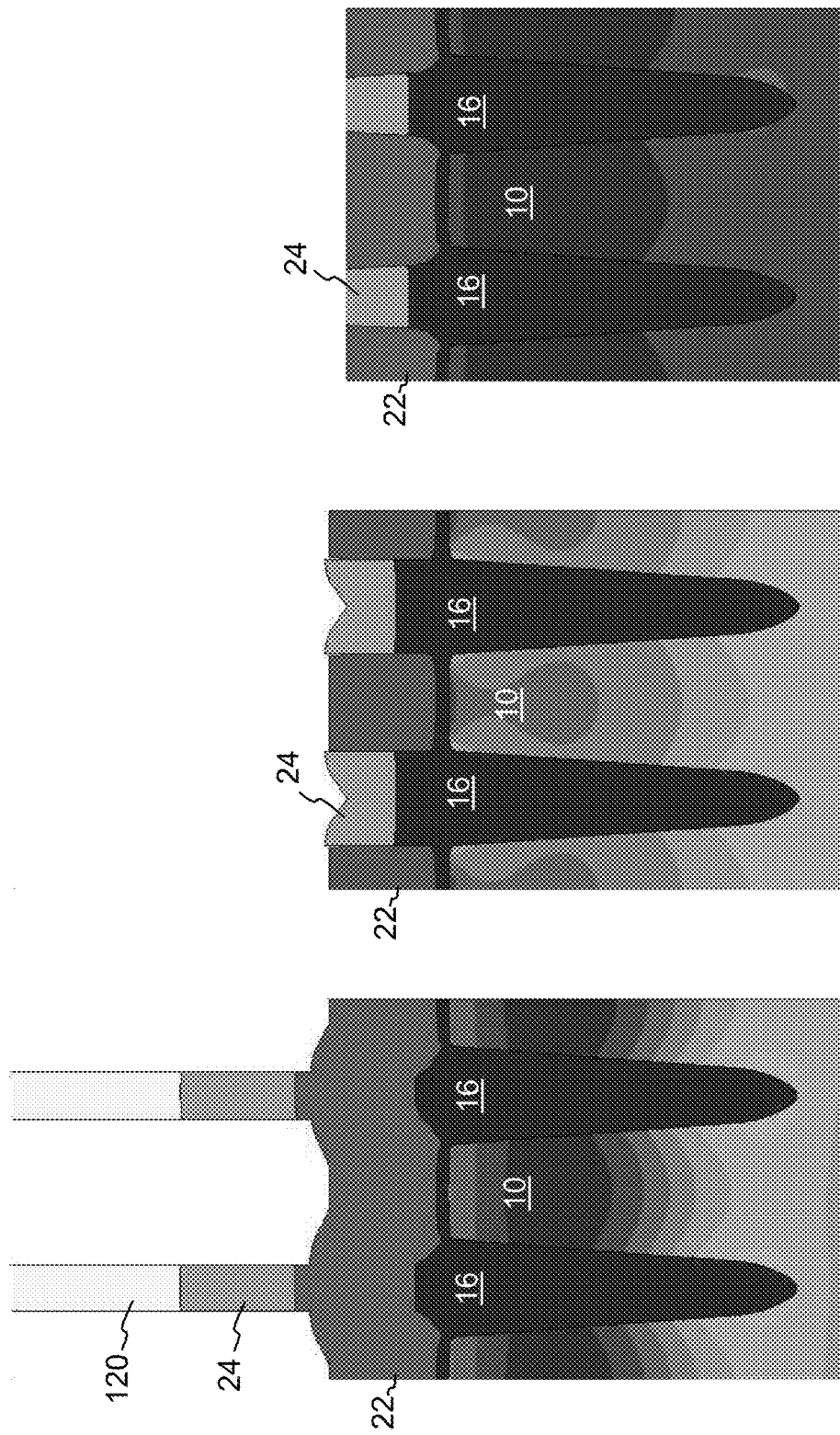

METHOD OF FORMING FLASH MEMORY WITH SEPARATE WORDLINE AND ERASE GATES

RELATED APPLICATIONS

This application claims the benefit of U.S. Provisional Application No. 62/244,688, filed Oct. 21, 2015, and which is incorporated herein by reference.

FIELD OF THE INVENTION

The present invention relates to non-volatile memory devices, and more particularly to optimization of memory cell formation.

BACKGROUND OF THE INVENTION

Non-volatile memory devices are well known in the art. For example, a split-gate memory cell is disclosed in U.S. Pat. No. 5,029,130 (which is incorporated herein by reference for all purposes). This memory cell has a floating gate and a control gate disposed over and controlling the conductivity of a channel region of the substrate extending between source and drain regions. It is also known to form such memory cells on the same wafer as low voltage (LV) logic devices and/or high voltage (HV) logic devices, where the memory cells and logic devices can share common elements or material layers.

Scaling down the size of the memory cell presents several challenges. For example, it is known to use the same oxide (with the same thickness) under the control gate of the memory cell and the logic gate for the HV logic devices. However, the memory cell current will become too low as the cell diffusion (active area) shrinks, and reducing control gate length to increase cell current will increase array leakage making it difficult to reduce the length of the control gate. In addition, the control gate is used to erase the memory cell through a tunnel oxide separating the control and floating gates. However, if the tunnel oxide is related to the HV device oxide, reducing oxide thickness may cause data retention failures.

U.S. Pat. No. 7,868,375 discloses a split-gate memory cell with four gates: a floating gate and select gate (also called a word line or word line gate) that together control the two portions of the channel region, a coupling gate over the floating gate, and an erase gate over the source region. However, scaling this memory cell configuration down in size is difficult given the extra gate over the floating gate.

BRIEF SUMMARY OF THE INVENTION

The aforementioned problems and needs are addressed by a method of forming a non-volatile memory cell by forming, in a substrate of a first conductivity type, spaced apart first and second regions of a second conductivity type, defining a channel region there between; forming a floating gate disposed over and insulated from a first portion of the channel region and over a portion of the first region, wherein the floating gate includes a sharp edge disposed over the first region; forming a tunnel oxide layer around the sharp edge; forming an erase gate over and insulated from the first region, wherein the erase gate includes a notch facing the sharp edge, and wherein the notch is insulated from the sharp edge by the tunnel oxide layer; and forming a word line gate disposed over and insulated from a second portion of the channel region which is adjacent to the second region, wherein the forming of the word line gate is performed after the forming of the tunnel oxide layer and the forming of the erase gate.

Other objects and features of the present invention will become apparent by a review of the specification, claims and appended figures.

BRIEF DESCRIPTION OF THE DRAWINGS

FIGS. 1A-20A are side cross sectional views along the column direction, illustrating the steps in forming the memory cells of the present invention.

FIGS. 1B-13B are side cross sectional views along the row direction, illustrating the steps in forming the memory cells of the present invention.

FIGS. 1C-5C are perspective views illustrating the steps in forming the memory cells of the present invention.

FIG. 21 is a chart showing exemplary operational voltages for reading, erasing and programming a target memory cell.

FIGS. 30A-34A illustrate a lithographic technique for forming the floating gate 22.

FIGS. 30B-34B illustrate a self-aligned STI technique for forming the floating gate 22.

FIGS. 30C-34C illustrate a CMP technique for forming the floating gate 22.

DETAILED DESCRIPTION OF THE INVENTION

The present invention is directed to a non-volatile memory device, and a process for its manufacture, that forms the memory cell word line gates and the logic device gates from the same conductive material, which allows the cell current to be increased with a thinner gate oxide and shorter gate length. An erase gate is added, and is formed before the formation of the word line gate. The erase gate protects the tunnel oxide from subsequent processing. An HKMG (high k dielectric plus metal gate) can be incorporated to achieve higher current drives. The memory cell has a low profile and therefore is more compatible with low profile logic devices formed on the same wafer, especially because there is no coupling gate over the floating gate. Finally, the number of masking steps needed to form the memory cell is fewer than comparable memory cells.

The memory cells are formed in columns, which are separated by columns of isolation regions. FIGS. 1A-20A are cross sectional views along the column direction, and FIGS. 1B-13B are cross sectional views along the orthogonal row direction, and FIGS. 1C-5C are perspective views showing the process of forming the memory cells according to the present invention. While a single memory cell is shown, it should be appreciated that an array of such memory cells are formed simultaneously. Also formed on the same substrate are low voltage LV logic devices and high voltage HV logic devices.

Figure 1C:
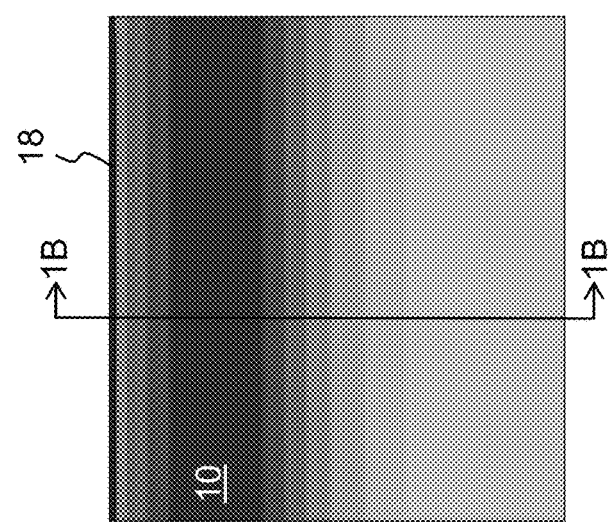
Figure 1B:
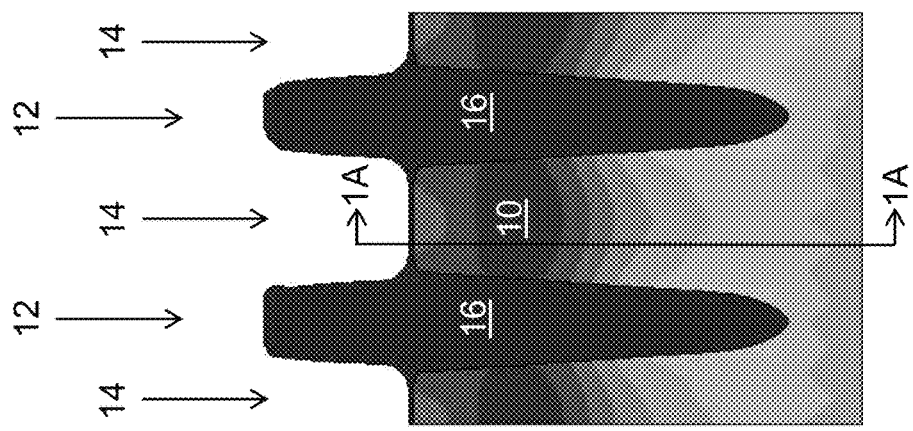
Figure 1A:
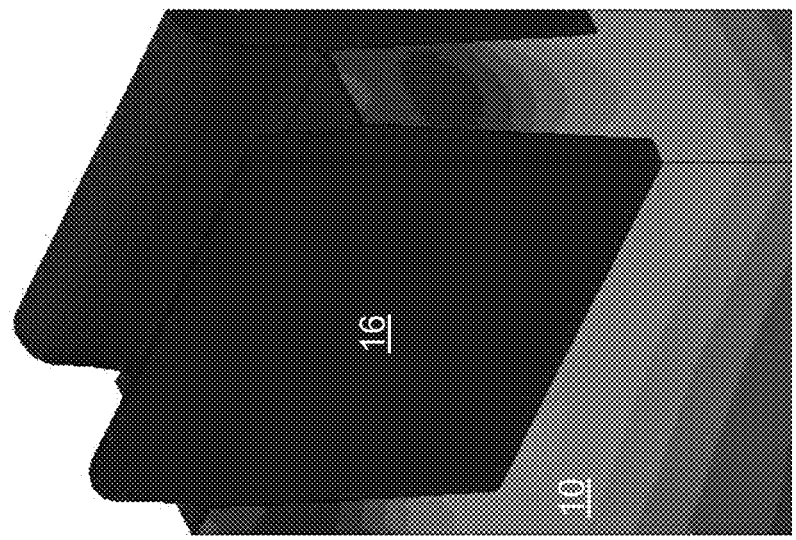
Figure 2A:
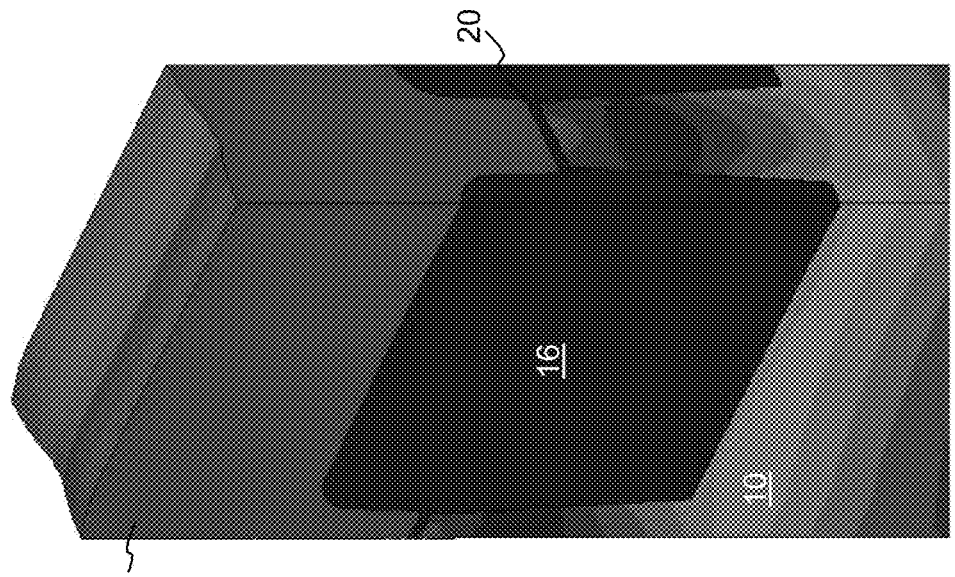
Figure 2B:
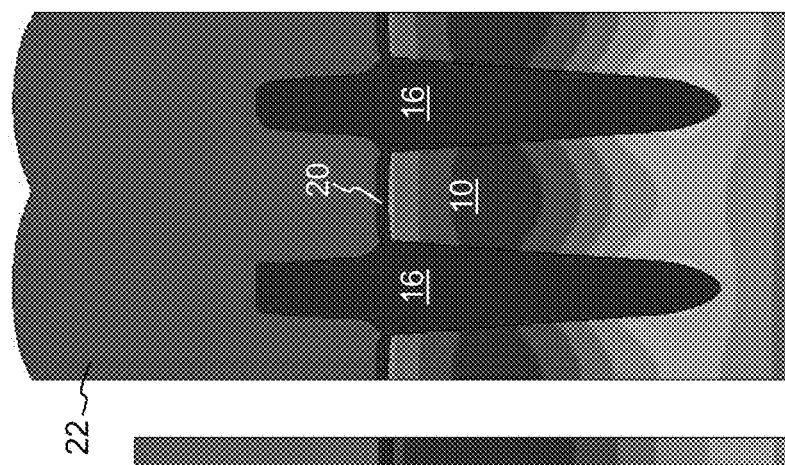
Figure 2C:
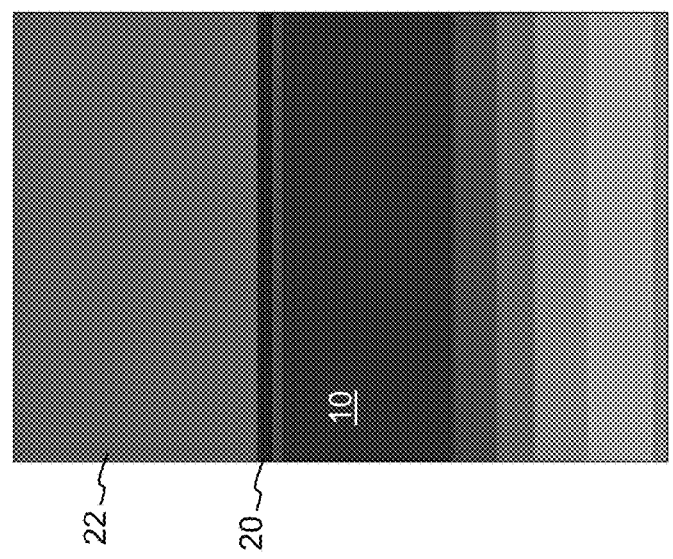
Figure 3C:
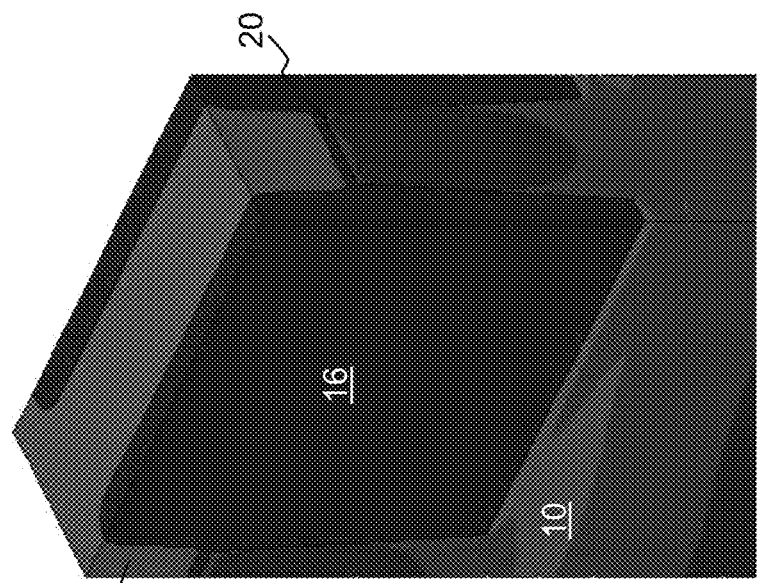
Figure 3B:
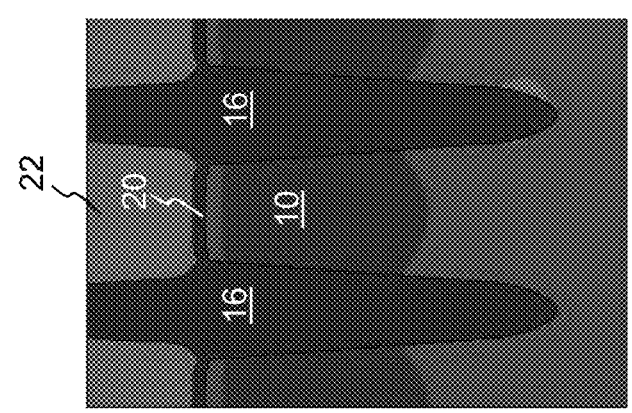
Figure 3A:
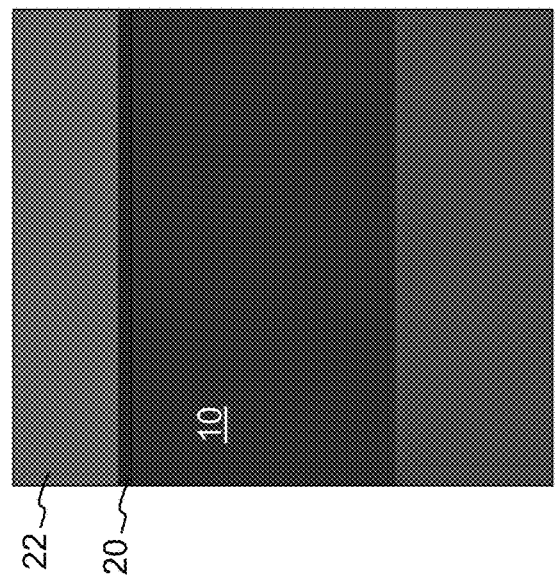

The process begins by forming STI (shallow trench isolation) in trenches in the silicon substrate 10, to define isolation regions 12 (with active regions 14 there between), where the STI 16 (e.g. oxide) extends above the surface of the silicon substrate 10. This process is well known. A pad oxide layer 18 is formed on the surface of the substrate 10, as shown in FIGS. 1A, 1B and 1C. HV and cell well implants are performed at this time (i.e. for the HV logic device and memory cell areas). Pad oxide 18 can be removed, and then a floating gate (FG) oxide 20 is formed over the structure, followed by a deposition of polysilicon 22, as shown in FIGS. 2A, 2B and 2C. An implantation and anneal for the polysilicon 22 is performed, followed by a chemical mechanical polish (CMP) to planarize the top surface of the polysilicon 22 (and that of STI oxide 16), as shown in FIGS. 3A, 3B and 3C.

Figure 4C:
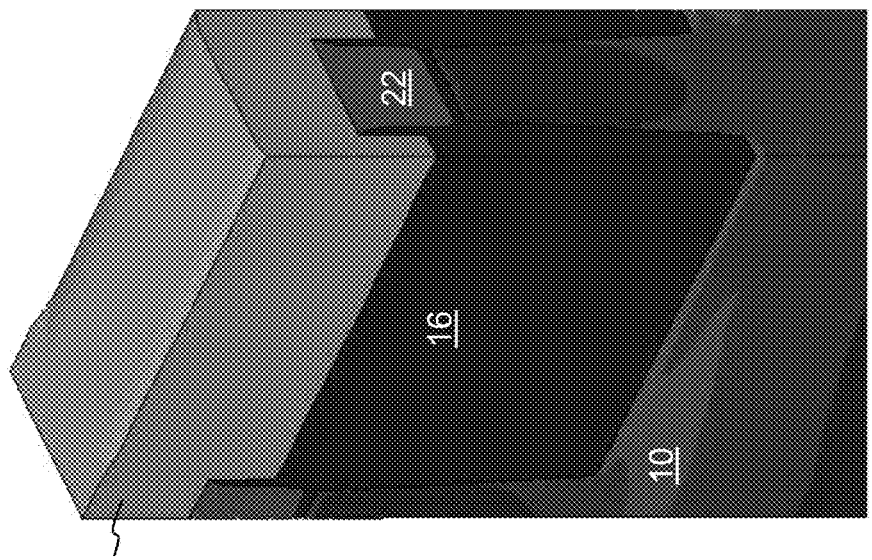
Figure 4B:
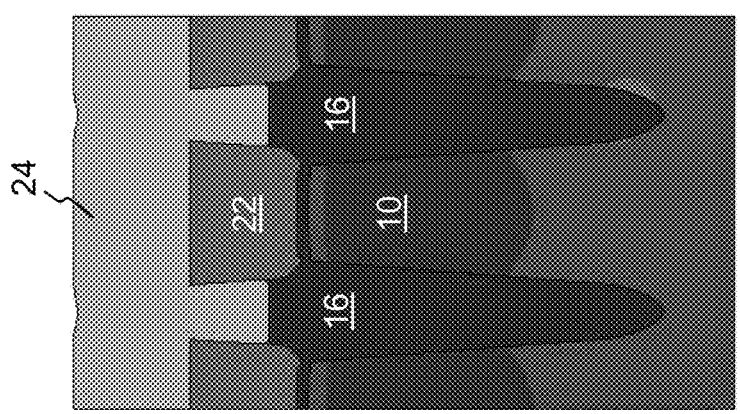
Figure 4A:
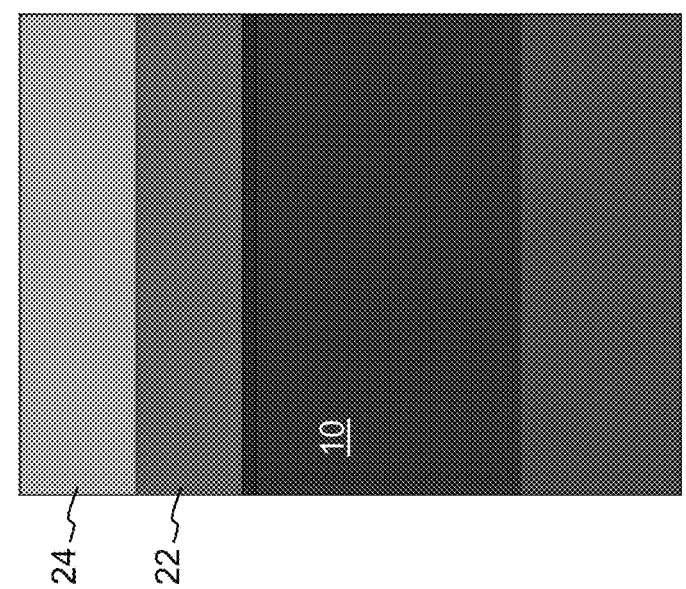
Figure 5C:
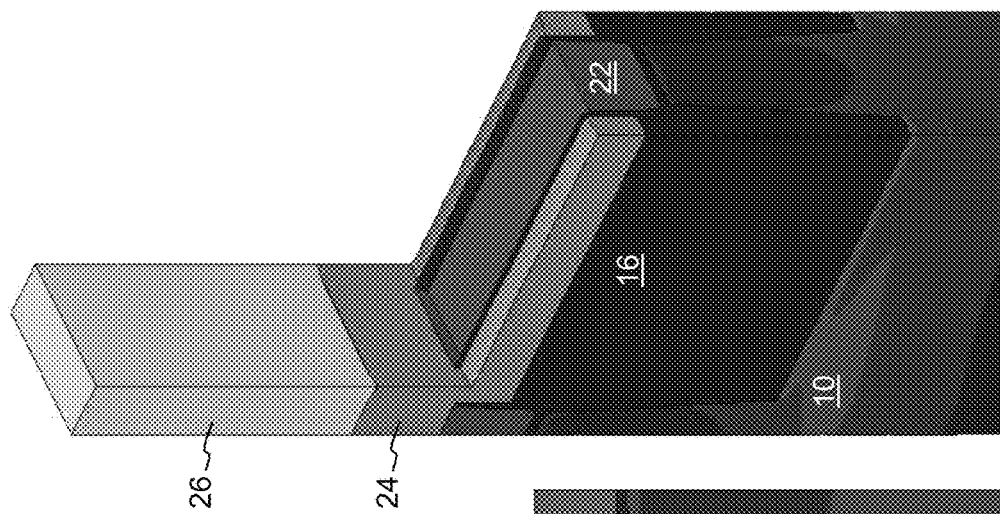
Figure 5B:
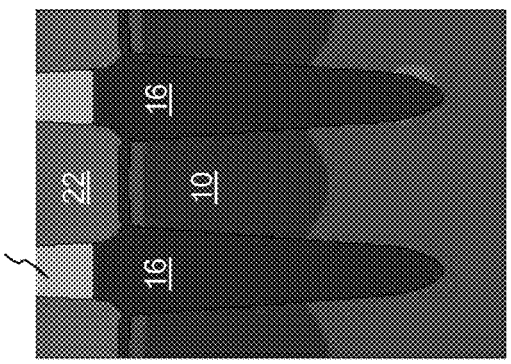
Figure 5A:
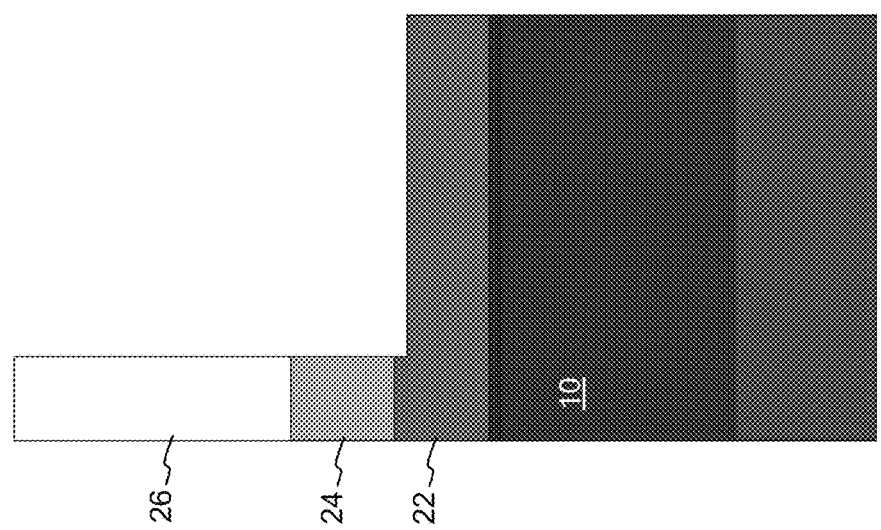
Figure 6B:
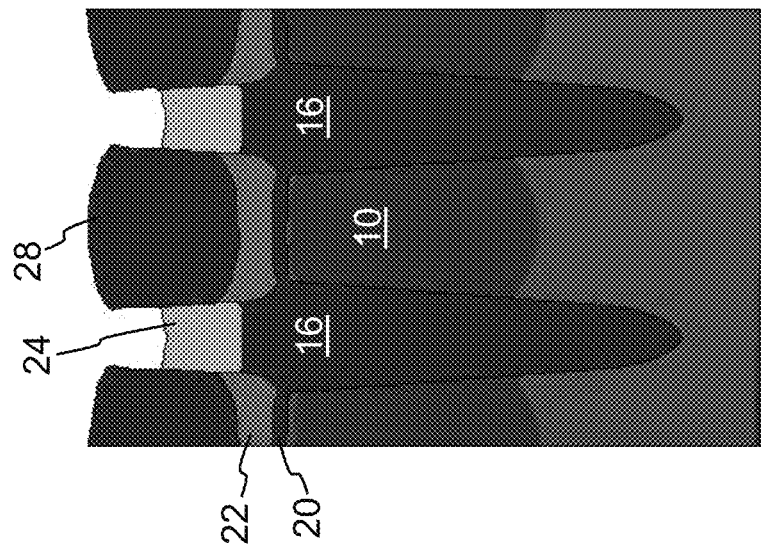
Figure 6A:
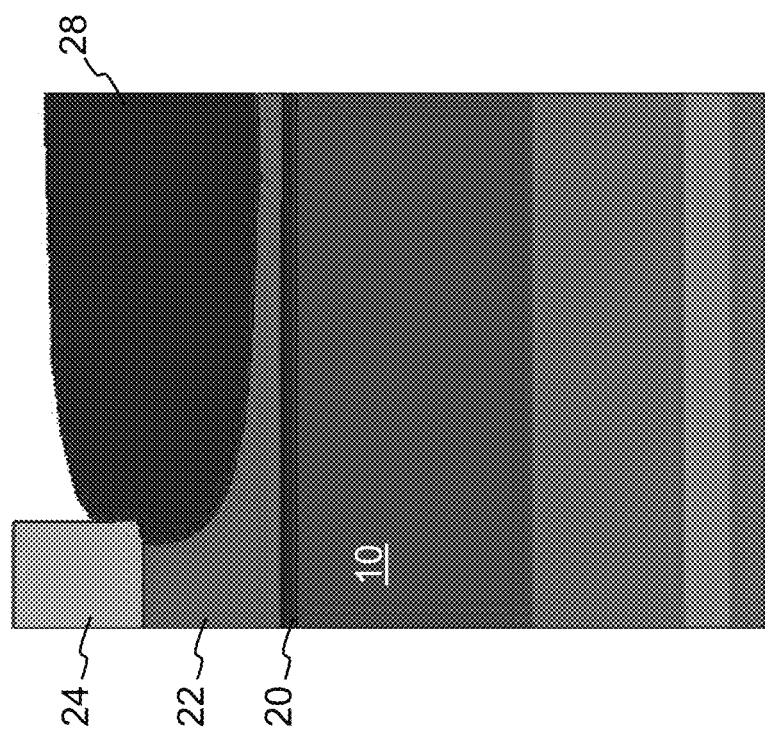

An oxide etch is then used to reduce the height of the STI oxide 16 (closer to but still above the substrate surface). A layer of nitride 24 is then deposited over the structure, as shown in FIGS. 4A, 4B and 4C. Photoresist 26 is deposited over the structure, with portions thereof selectively removed by a photolithography masking step (involving selective exposure through a mask, and selective removal of portions of the photo resist), leaving portions of the nitride 24 exposed. A nitride etch is then used to remove the exposed portions of the nitride 24, exposing portions of the polysilicon 22. A poly recess etch is used to recess the exposed top surface portions of polysilicon 22, as shown in FIGS. 5A, 5B and 5C. After the photoresist 26 is removed, an oxidation process is performed, which oxidizes the top surface of the exposed polysilicon 22, leaving oxide 28 on polysilicon 22. The formation of oxide 28 consumes polysilicon 22 non-uniformly (less consumption near nitride 24), leaving the polysilicon 22 with a curved upper surface, as shown in FIGS. 6A and 6B.

Figure 7B:
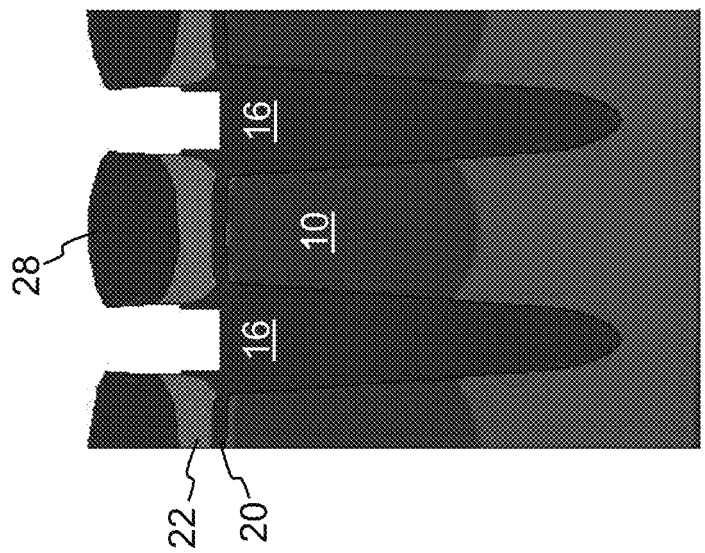
Figure 7A:
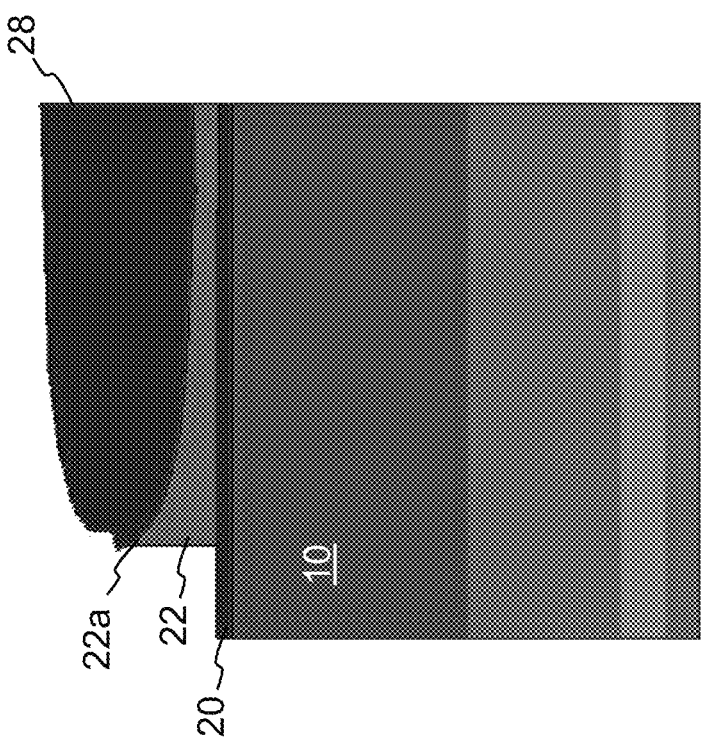
Figure 8B:
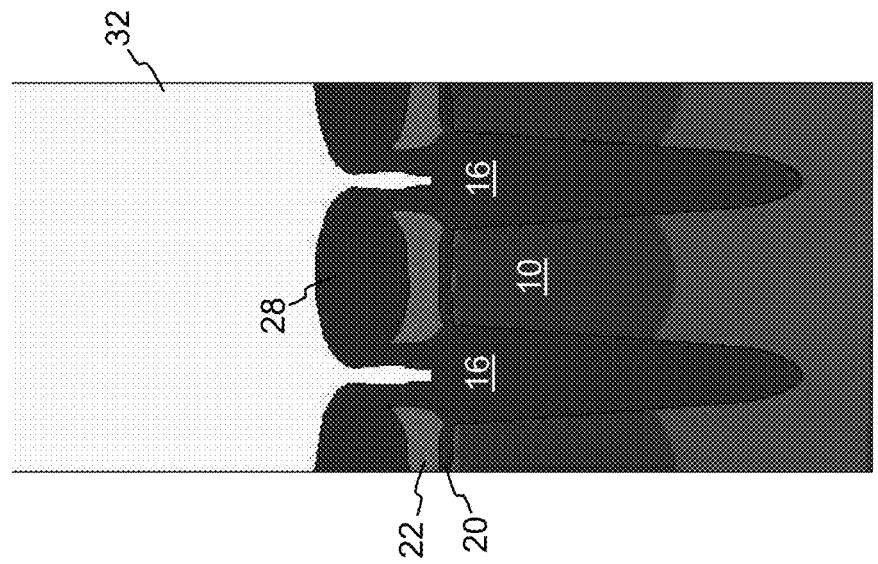
Figure 8A:
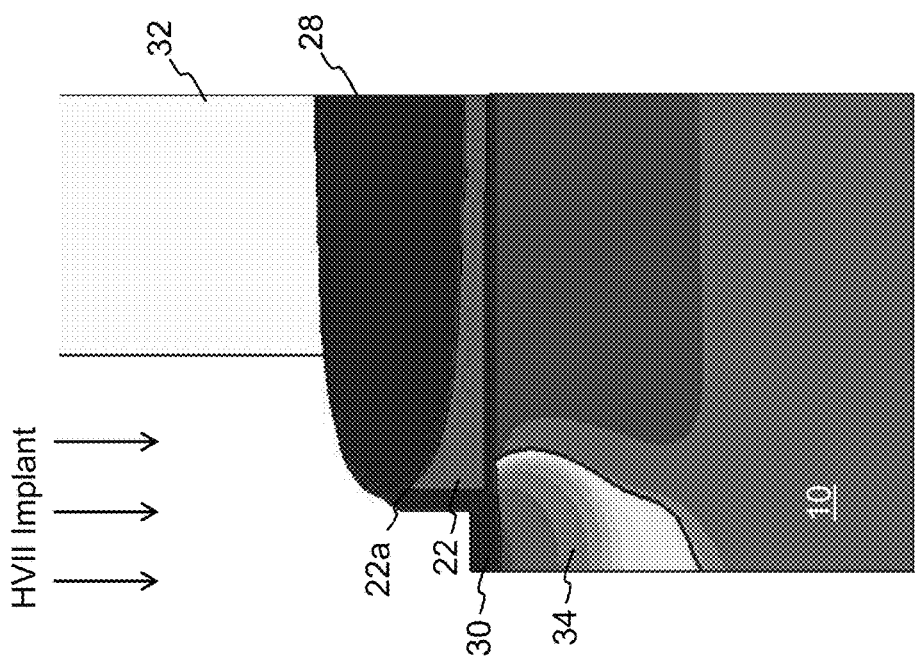
Figure 9B:
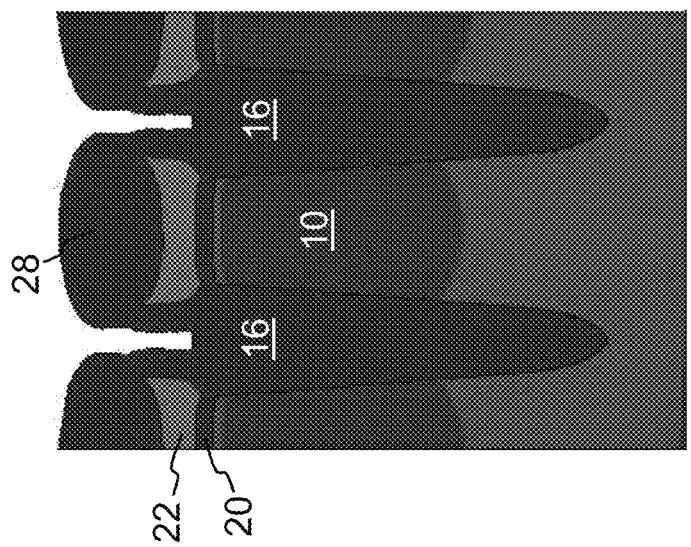
Figure 9A:
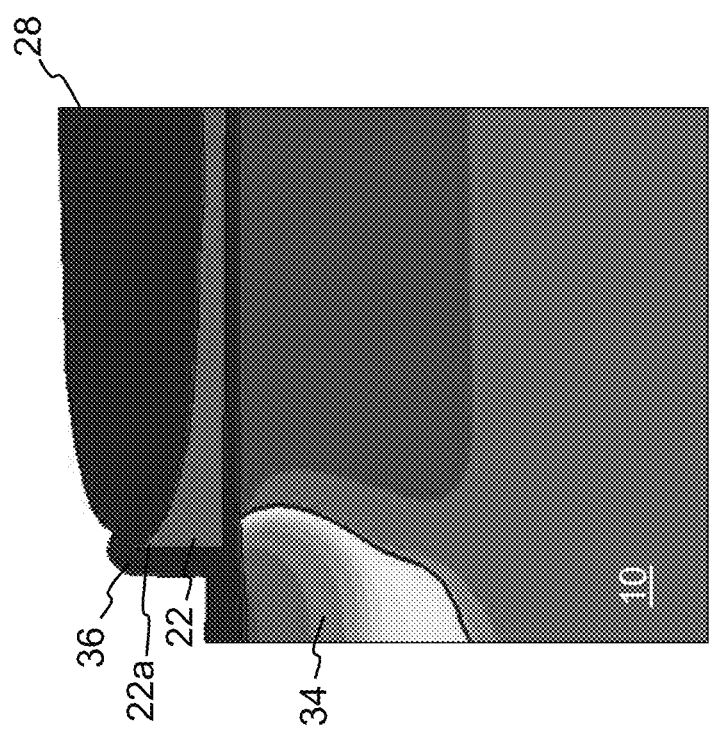

A nitride etch is then used to remove the remaining portions of the nitride 24, exposing a new portion of the polysilicon 22. A poly etch is then used to remove the newly exposed portions of the polysilicon 22 such that the curved upper surface of the polysilicon 22 terminates in a sharp edge 22a, as shown in FIGS. 7A and 7B. As shown, there is some loss of the STI oxide 16 due to the polysilicon etching. A screen oxide 30 is deposited on the structure, followed by a masking step to form photoresist 32 over the structure except for portions thereof adjacent the sharp edge 22a of polysilicon 22. A HVII implantation is then performed through the screen oxide 30 and into the substrate 10, to form source region 34, as shown in FIGS. 8A and 8B. An oxide etch is used to remove the screen oxide 30. An oxide layer is formed in the logic device areas of the wafer, and a tunnel oxide layer 36 is formed in the memory area (extending around the sharp edge 22a of the polysilicon 22), as shown in FIGS. 9A and 9B (after removal of photo resist 32).

Figure 11B:
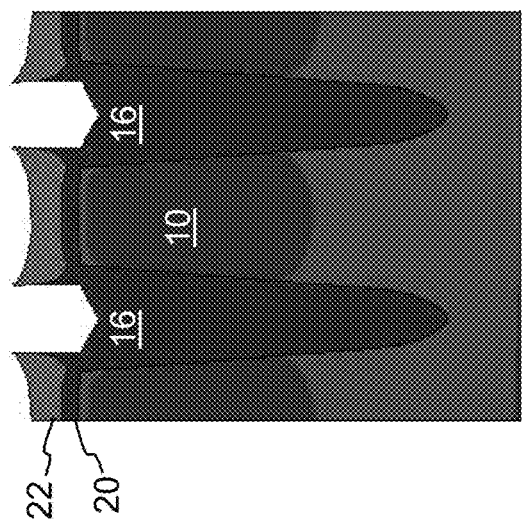
Figure 11A:
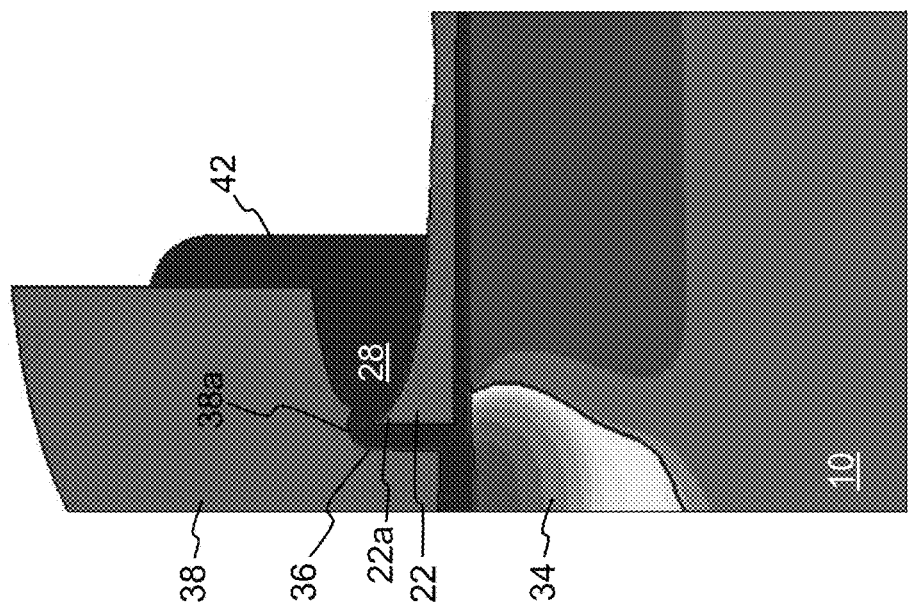
Figure 12B:
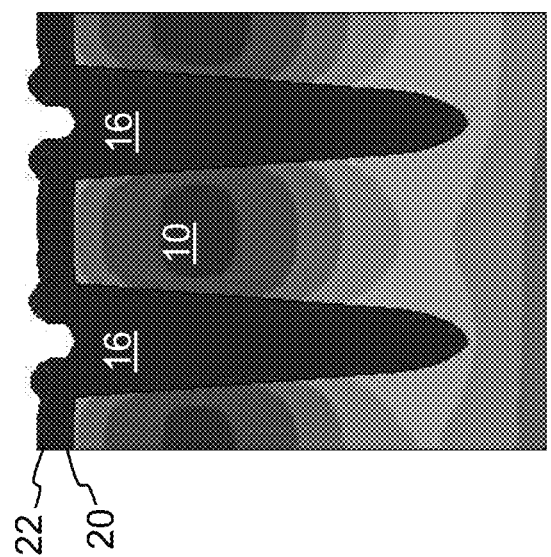
Figure 12A:
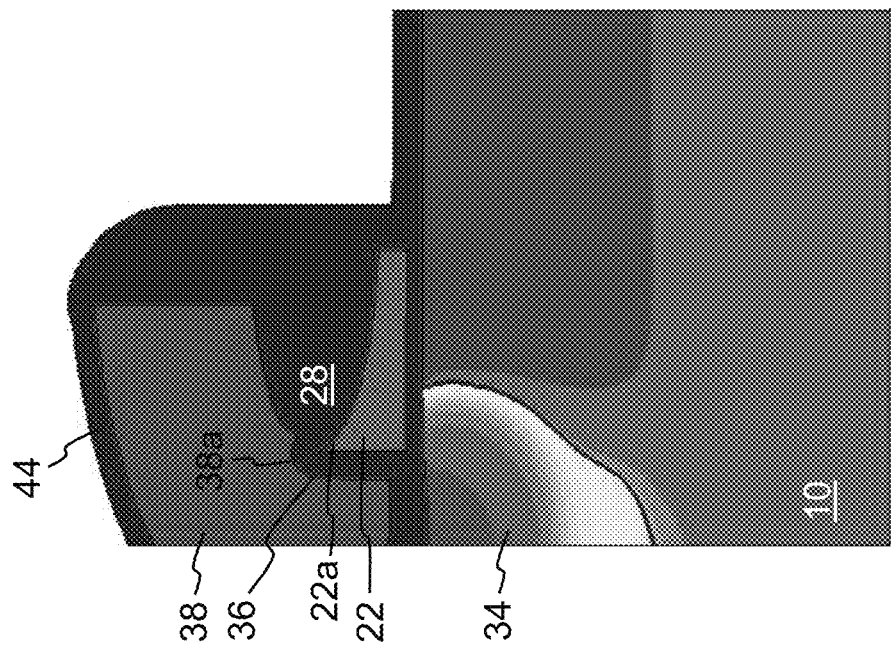
Figure 13B:
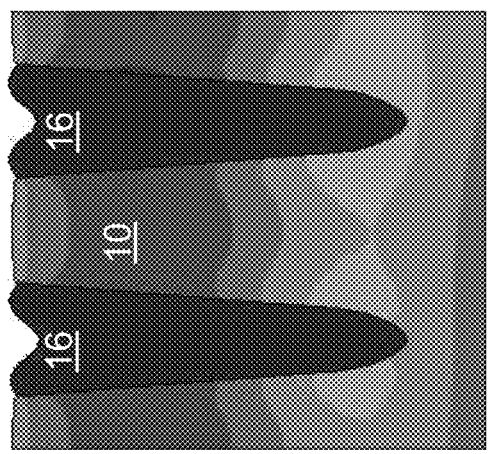
Figure 13A:
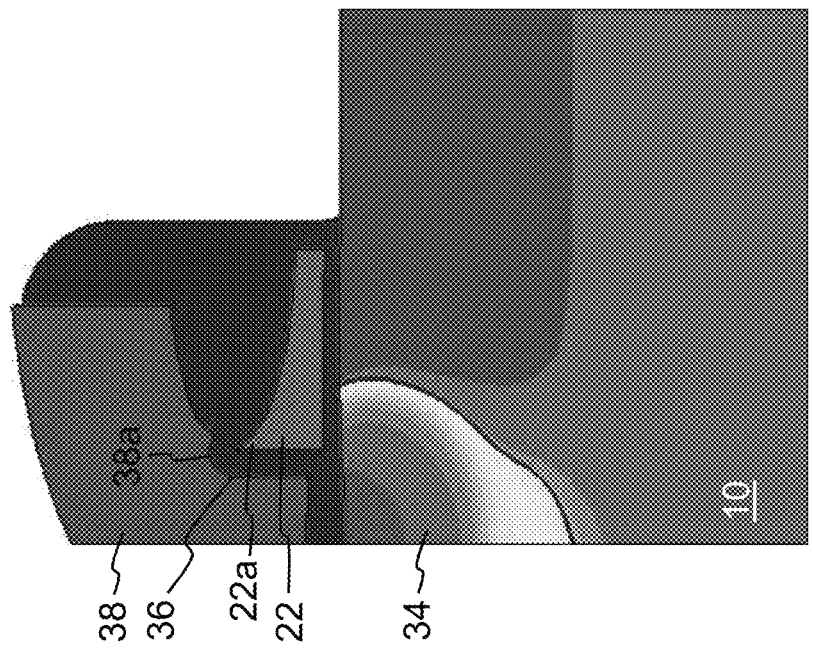

Polysilicon 38 is deposited over the structure. A masking step is used to form photoresist 40 over that portion of the polysilicon 38 that is over the sharp edge 22a. A poly etch is used to remove the exposed portions of the polysilicon 38, leaving just a block of the polysilicon 38 having a notch (i.e. indentation) 38a facing and extending partially around the sharp edge 22a, as shown in FIGS. 10A and 10B. After photoresist removal, an oxide layer is deposited over the structure. An oxide etch is then performed, leaving oxide spacer 42 along the side of the polysilicon 38, and removing oxide 28 except for the portion under polysilicon 38, as shown in FIGS. 11A and 11B. A poly etch is then used to remove the upper portions of the polysilicon 38. An oxide layer 44 (HV oxide) is formed over the structure, as shown in FIGS. 12A and 12B. A LV well implant is performed for the logic devices. An oxide etch (which may be combined with a masking step that leaves exposed the memory and logic areas) is then used to remove the HV oxide 44 from poly 38 and the substrate surface, as shown in FIGS. 13A and 13B.

Figure 15A:
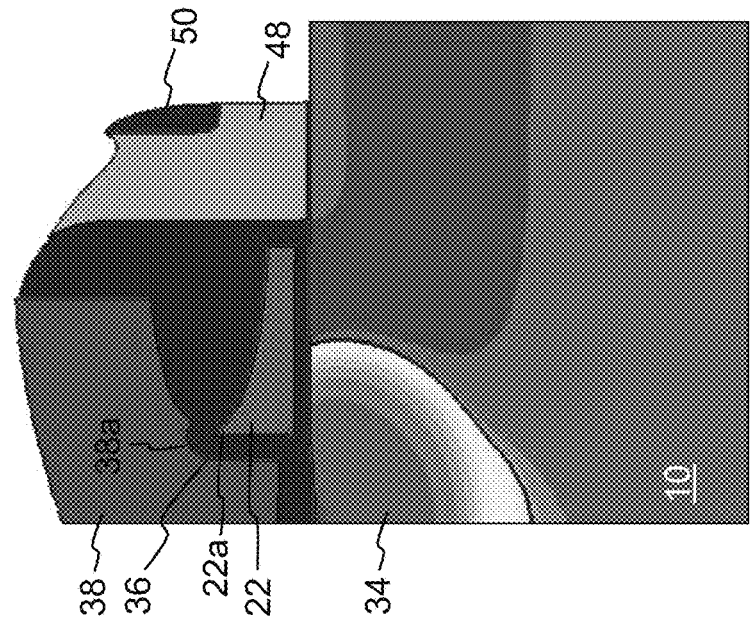
Figure 14A:
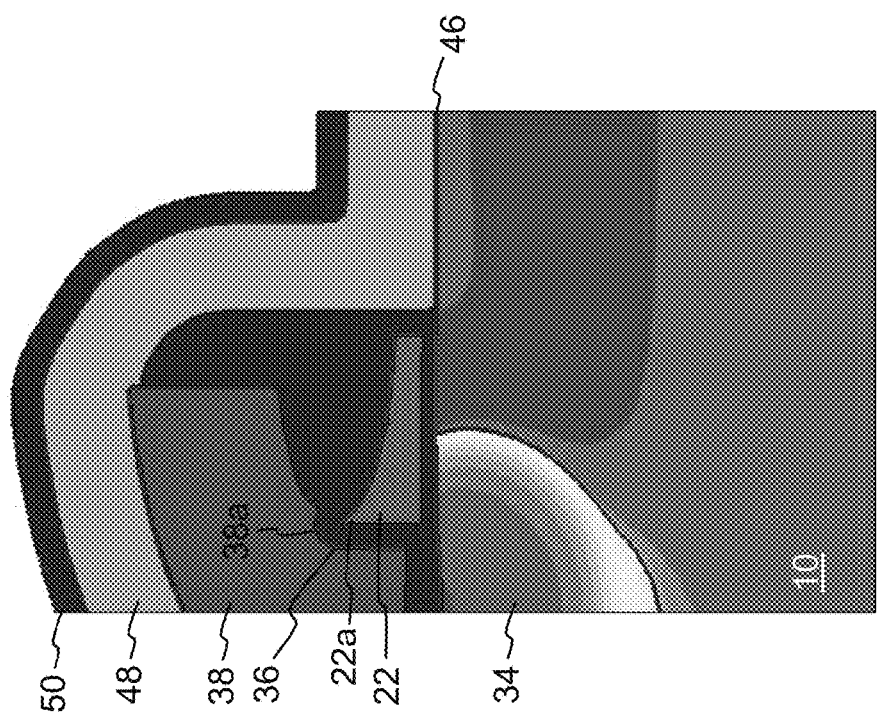

An oxide 46 is formed on the exposed substrate 10 (which can be the same oxide for the LV logic devices). A conformal polysilicon layer 48 is then deposited on the structure, and is subjected to N+ doping. An oxide layer 50 is deposited on the poly 48, as shown in FIG. 14A. This same poly is used for the gates in the logic device area. An oxide etch is used to form a spacer of the oxide 50 along the vertical portion of the poly layer 48. A poly etch is then performed to remove the portion of the poly layer 48 over poly layer 38, and the portion of the poly layer 48 over the substrate, leaving a portion of poly layer 48 adjacent the FG poly 22 on one side and the oxide spacer 50 on the other side, as shown in FIG. 15A. No masking step is needed for defining this remaining poly 48. Logic device poly gates can be formed during this same poly etch (in conjunction with a masking step).

Figure 17A:
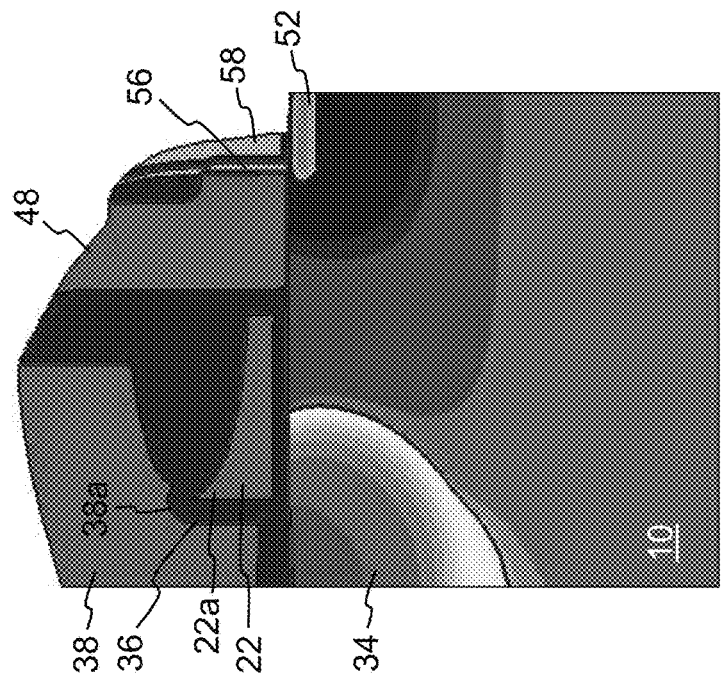
Figure 16A:
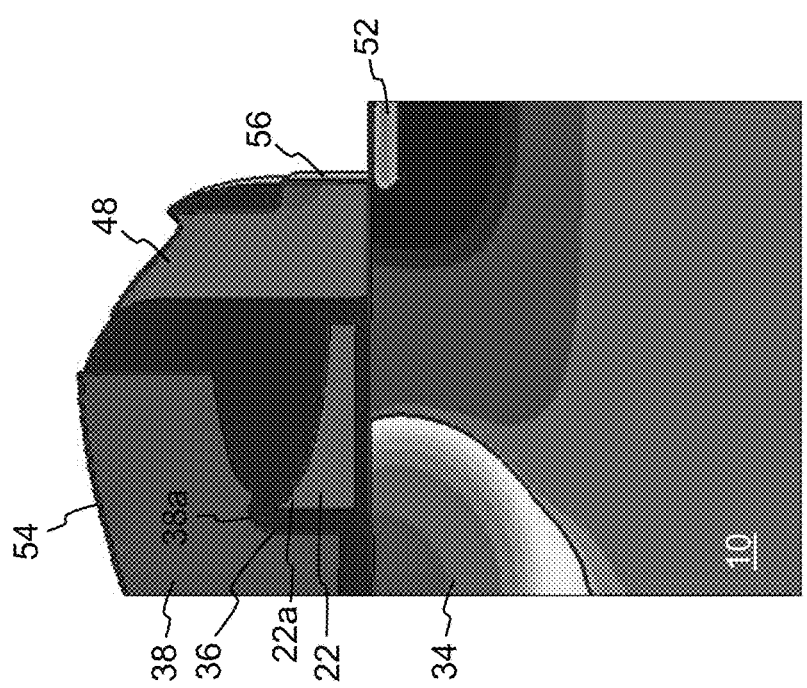
Figure 18A:
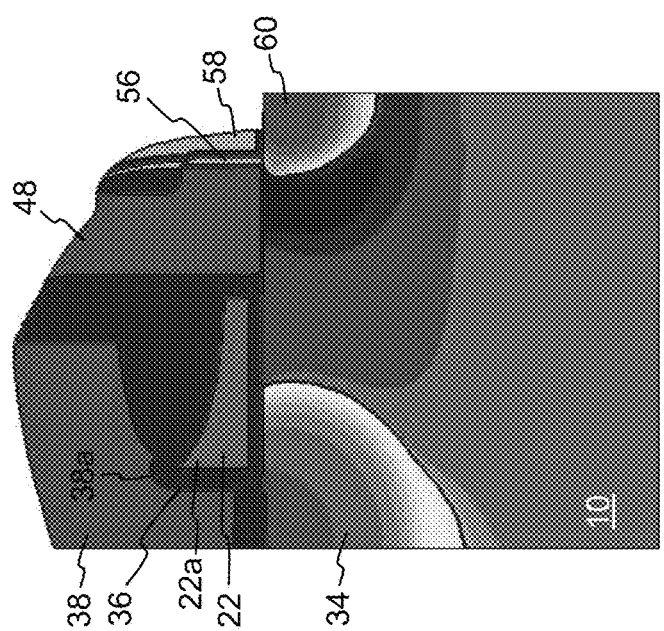

A cell Halo/LDD implant is used to form the LDD regions 52 in substrate 10. An oxide layer 54 is formed on the exposed surfaces of polysilicon 38 and 48, which is followed by a nitride deposition and etch to form nitride spacers 56 alongside the poly 48, as shown in FIG. 16A. An LDD spacer 58 is formed over the LDD region 52 and in the logic areas by forming a layer of oxide and a layer of nitride, and performing nitride and oxide etches, as shown in FIG. 17A. An N+ NNII masking step and implant is used to form drain region 60 in the exposed substrate adjacent the LDD spacer 58, as shown in FIG. 18A. This implant can also be used to form N+ junctions in the logic areas. A P+ PPII masking step and implant can be applied to the logic areas for forming P+ junctions. An anneal step is performed to complete the formations of the N+ and P+ junctions.

Figure 19A:
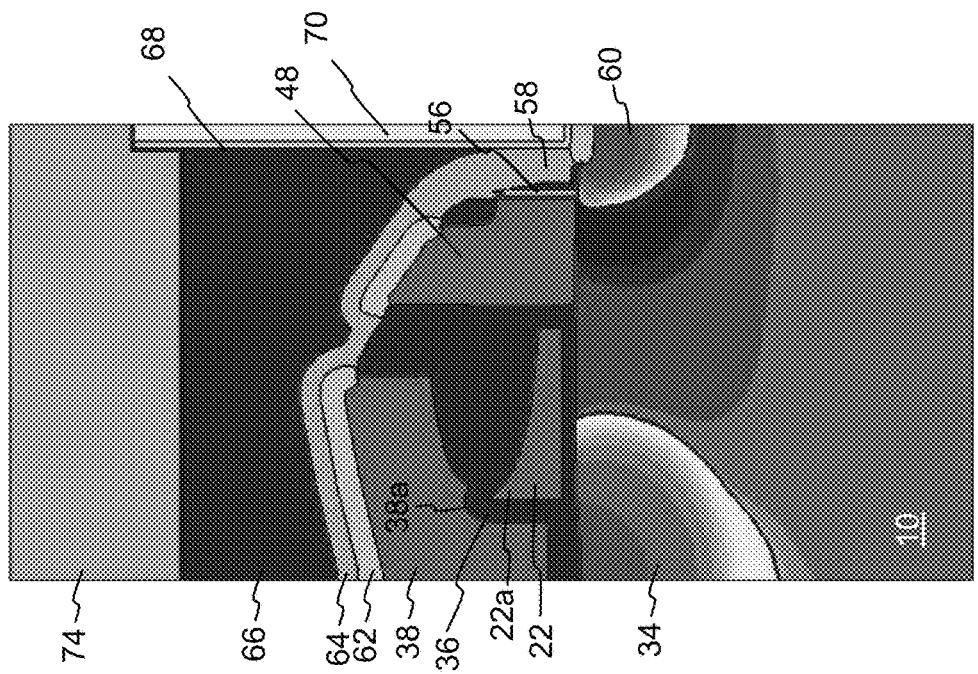

Silicide 62 is formed on the exposed surfaces of poly 38, poly 48 and drain region 60 of substrate 10 (for increased conductivity). A nitride layer 64 is formed over the structure. ILD insulation 66 is formed over the structure, followed by a masking and etch process to form contact hole 68 in the ILD reaching down to the drain (bit line BL) regions 60. The contact hole is filled with a conductive material (e.g. tungsten) by deposition and CMP etch to form bit line contact 70. An IMD layer is formed on the structure, followed by a metal deposition (e.g., copper Cu), a masking step, and a metal etch to form conductive bit lines 74 each electrically connecting together the bit line contacts 70 and drain regions 60 for an entire line of memory cells, as shown in FIG. 19A.

Figure 20A:
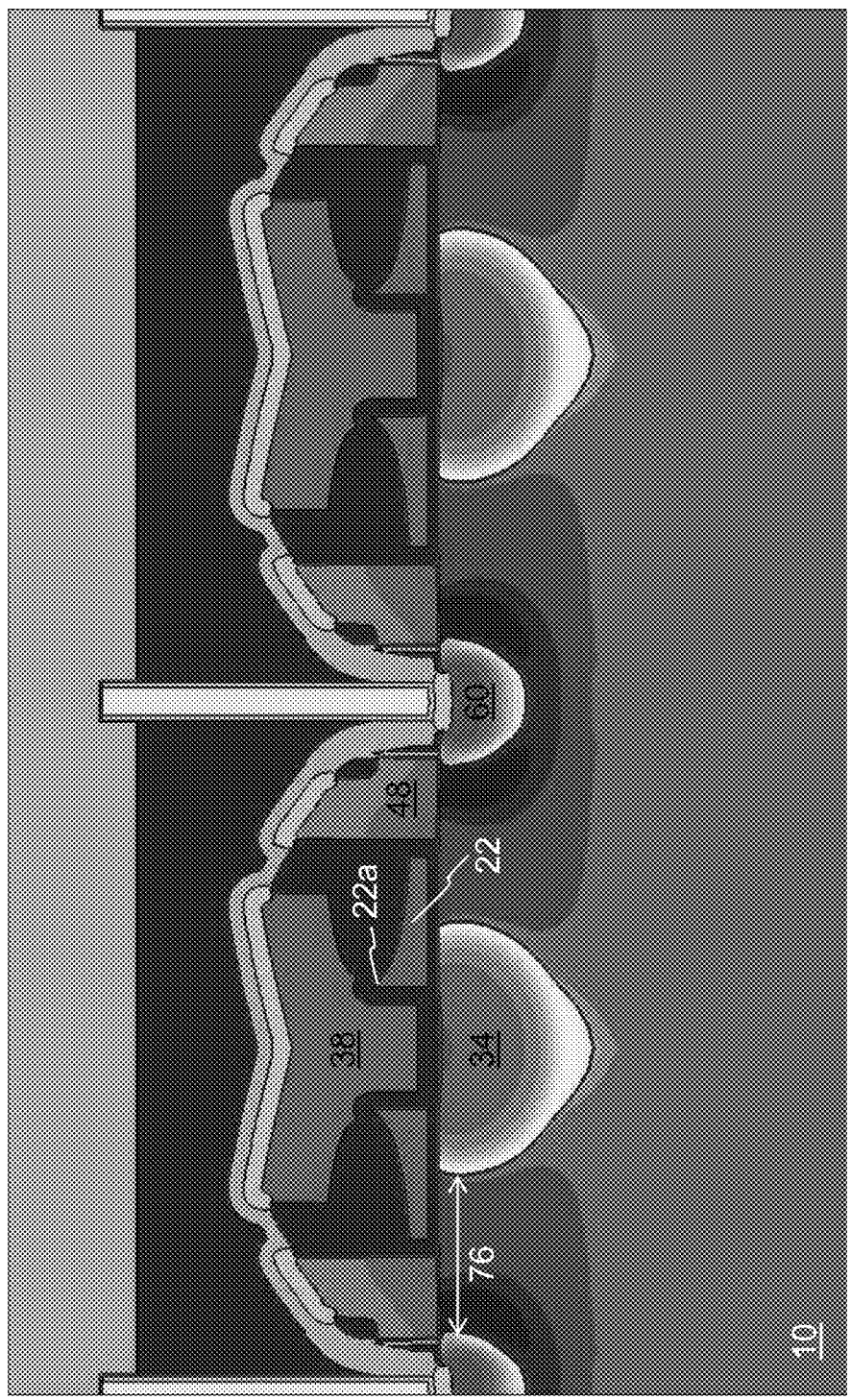

The final memory cell structure is illustrated in FIG. 20A. Pairs of memory cells each sharing a common source region 34 are formed. Each memory cell includes a floating gate 22 disposed over a first portion of the channel region 76 between the source region 34 and the drain (bit line) region 60, with sharp edge 22a facing erase gate 38 which is disposed over the source line 34. A word line gate 48 is disposed over the other portion of the channel region 76.

FIG. 21 illustrates exemplary operational voltages for reading, erasing and programming a target memory cell for the selected word-line, bit line, erase gate and source line containing the target memory cell, and for the unselected lines not containing the target memory cell.

Figure 22:
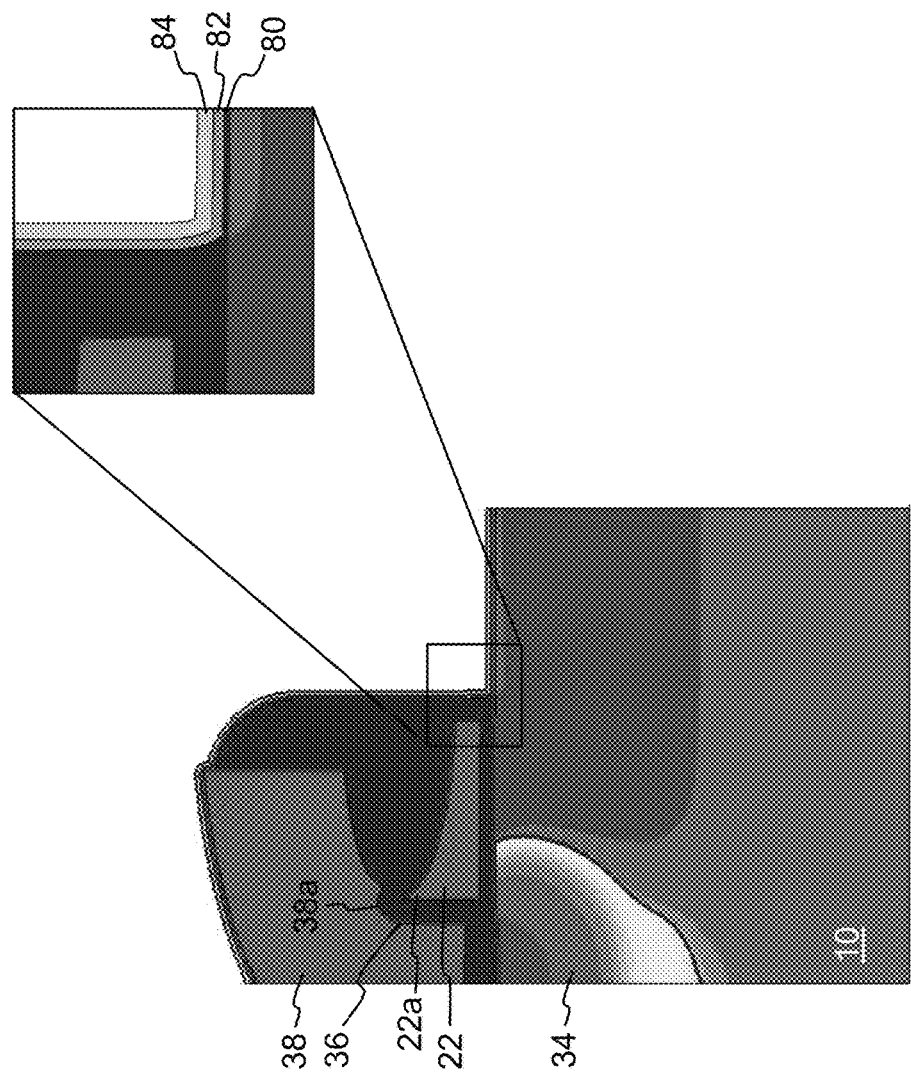
FIGS. 22-29 illustrate processing steps in an alternate embodiment that utilizes high K metal gates (HKMG).

FIGS. 22-29 illustrate the processing steps in an alternate embodiment that utilizes high K metal gates (HKMG). This alternate embodiment includes the same steps described above with respect to forming the structures in FIGS. 13A and 13B. An interfacial layer (IL) 80 such as thin oxide is then formed over the structure. A high K material layer 82 (i.e. having a dielectric constant K greater than that of oxide, such as $HfO_2$, $ZrO_2$, $TiO_2$, $Ta_2O_5$, or other adequate materials, etc.) is deposited on the IL layer 80. A capping layer 84, such as TiN, TaN, TiSiN, may be deposited on the structure to protect the high K material 82 from damage in the subsequent processing steps, as shown in FIG. 22.

Figure 24:
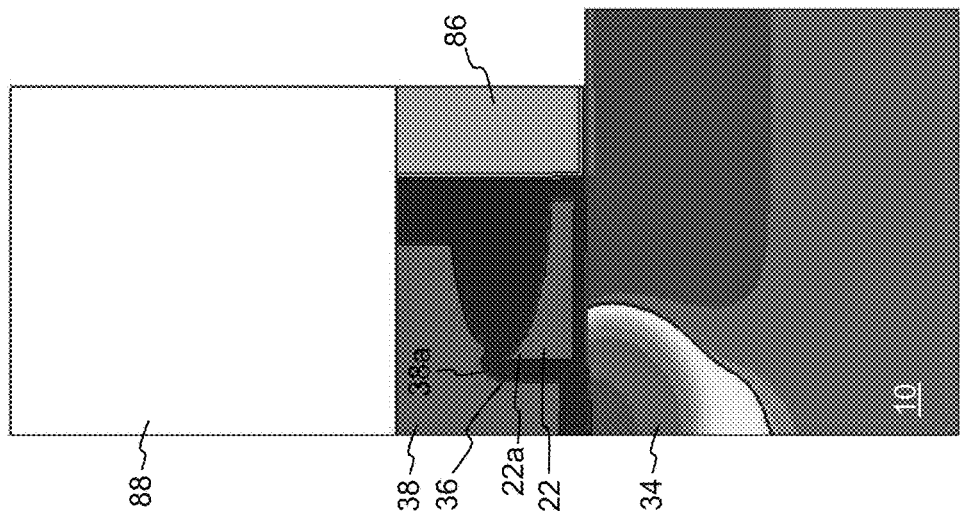
Figure 23:
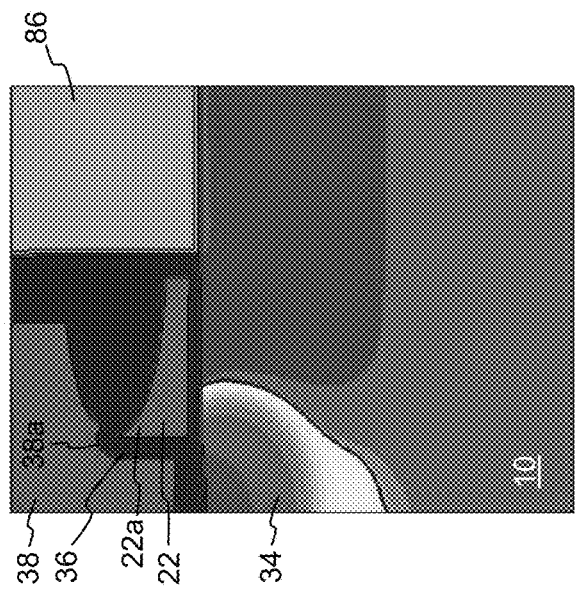
Figure 26:
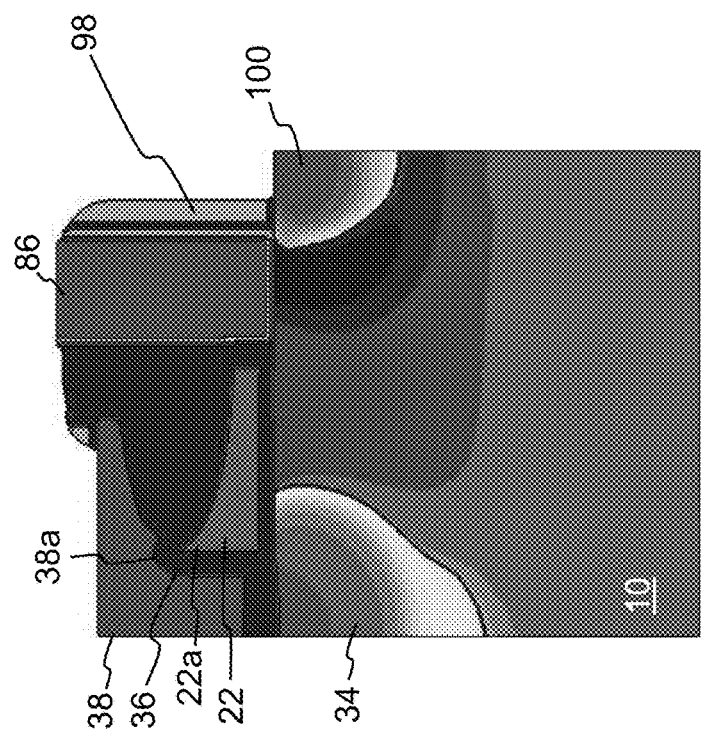
Figure 25:
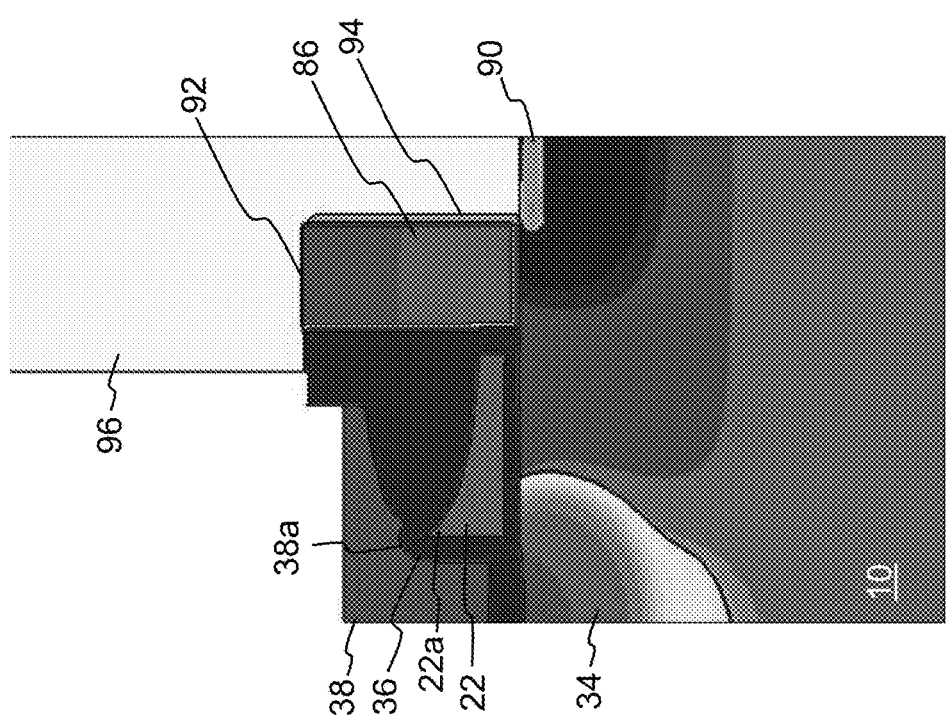

Polysilicon 86 is then deposited on the structure. A poly CMP is used to planarize the structure's upper surface, as shown in FIG. 23. N+ doping is then applied to the poly 86. A masking step is performed to form photoresist 88 over poly 38 and a portion of poly 86. A poly etch is used to remove the exposed portion of poly 86, defining the right edge of the remaining poly 86, as shown in FIG. 24. A cell Halo/LDD implant is used to form the LDD regions 90. After removal of photo resist 88, an oxide layer 92 is formed on the poly 86, which is followed by a nitride deposition and etch to form nitride spacers 94 alongside the poly 86. A masking step is performed to form photo resist 96 over the structure except for poly 38. A poly etch is performed to reduce the height of (to recess) the poly 38, as shown in FIG. 25. After photo resist removal, an LDD implant is performed for the logic areas, followed by the formation of an LDD spacer 98 over the LDD region 90 (and in the logic areas) by forming a layer of oxide and a layer of nitride, and performing nitride and oxide etches. An N+ NNII masking step and implant is used to form drain regions 100 in the exposed substrate 10 adjacent the LDD spacers 98, as shown in FIG. 26. This implant can also be used to form N+ junctions in the logic areas. A P+ PPII masking step and implant can be applied to the logic areas for forming P+ junctions. An anneal step is performed to complete the formations of the N+ and P+ junctions.

Figure 28:
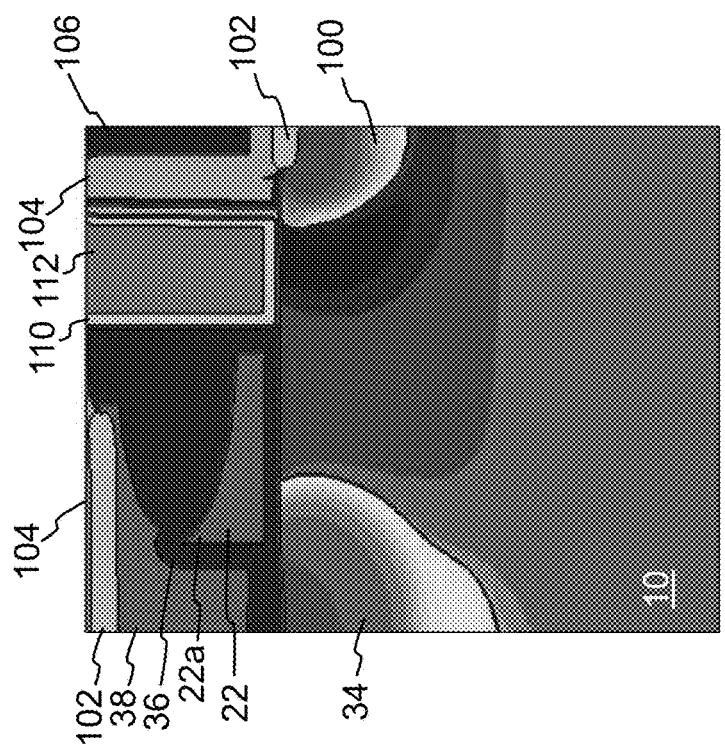
Figure 27:
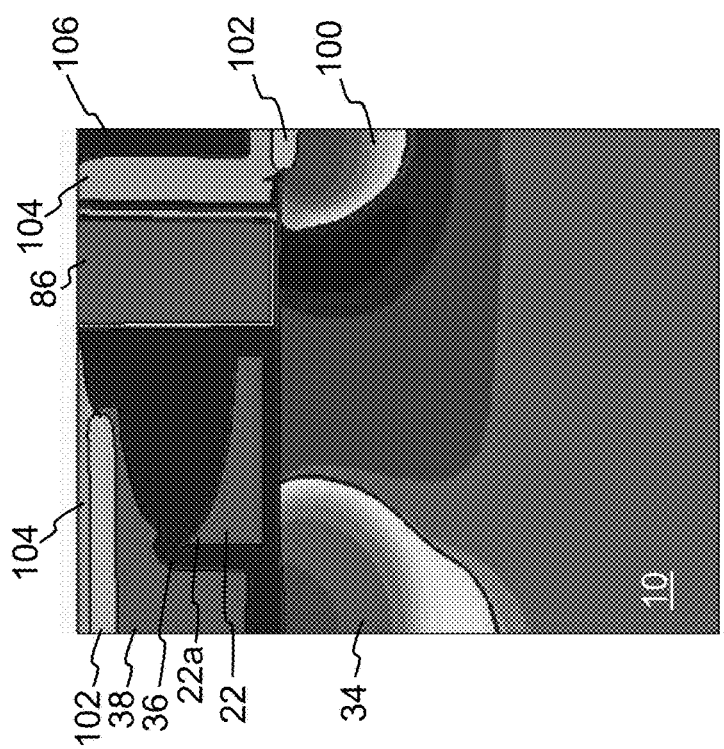

Silicide 102 is formed on the exposed poly surfaces and substrate surfaces. A nitride layer 104 is formed over the structure. ILD insulation 106 is then formed on the structure, followed by a CMP to planarize the top surface of the structure, as shown in FIG. 27. A poly etch is then used to remove poly 86. A PMOS WF metal layer 110 is formed over the structure by deposition. A masking step is used to leave exposed and remove the PMOS WF metal layer 110 from areas of the memory area other than the trenches left by the removal of poly 86, and NMOS logic areas. An NMOS WF metal layer is then deposited in the NMOS logic areas. A metal deposition and CMP etch is then performed to fill the trenches left from the removal of poly 86 with metal 112 (to form metal WL gates), and any other areas in which metal gates are to be formed, as shown in FIG. 28. The metal used can be AL.

Figure 29:
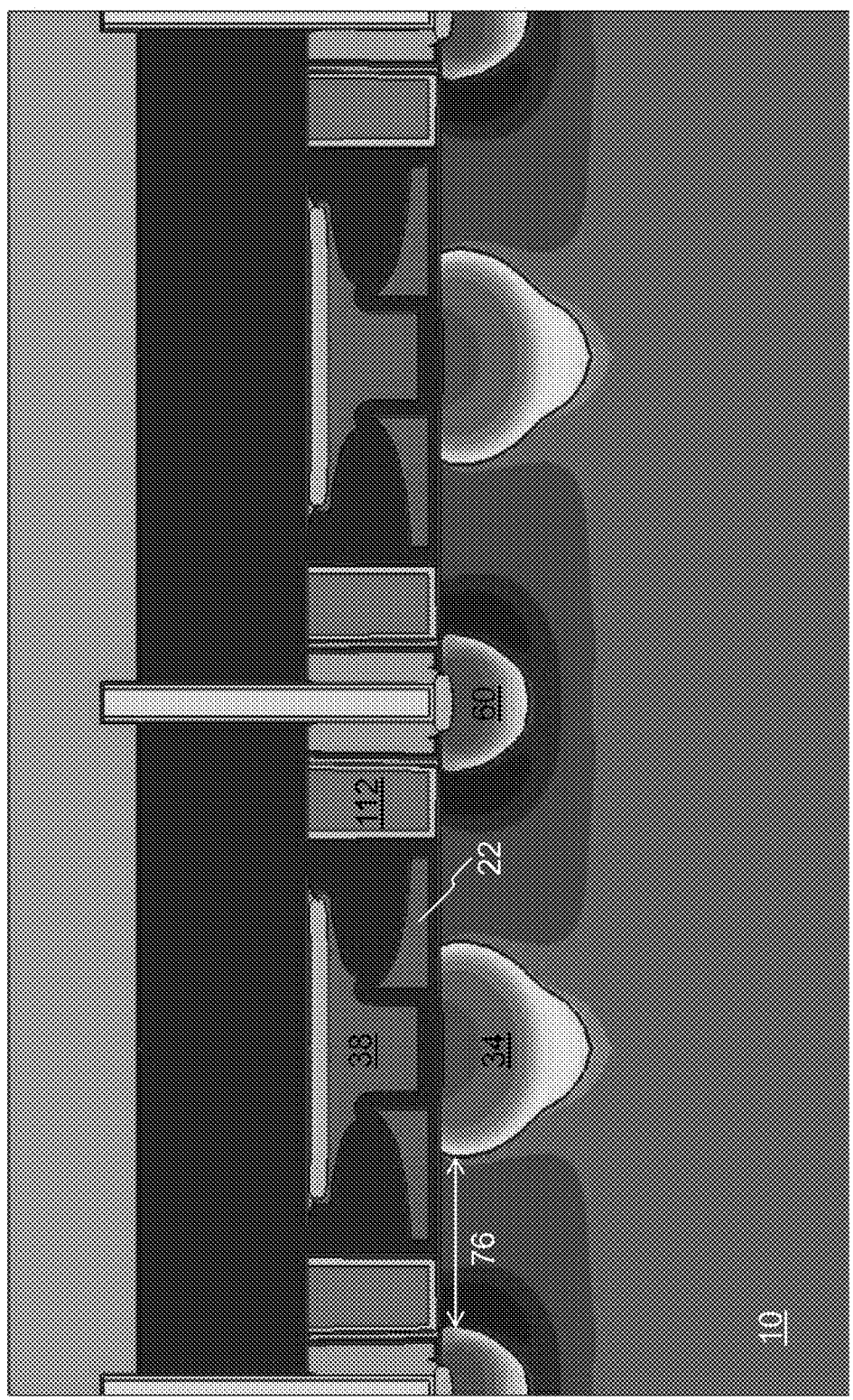
Figure 31C:
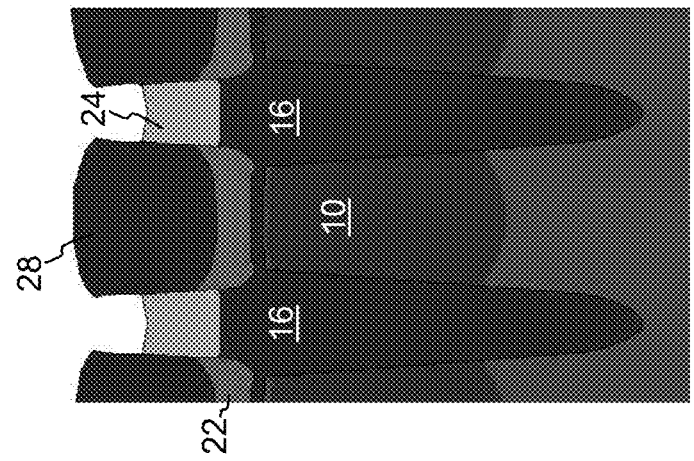
Figure 31B:
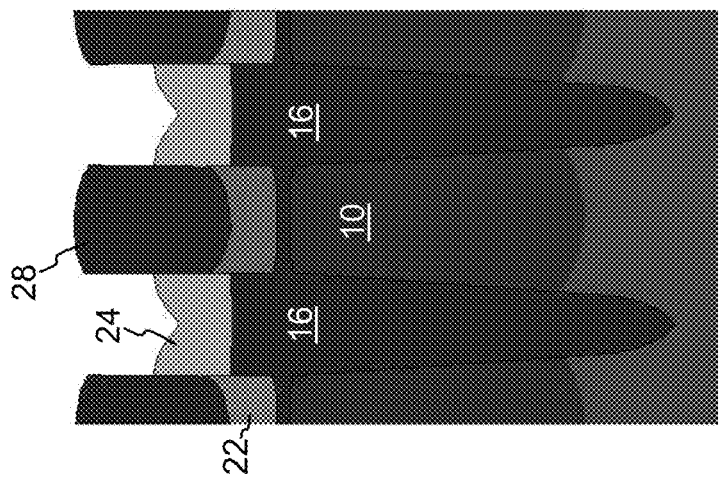
Figure 31A:
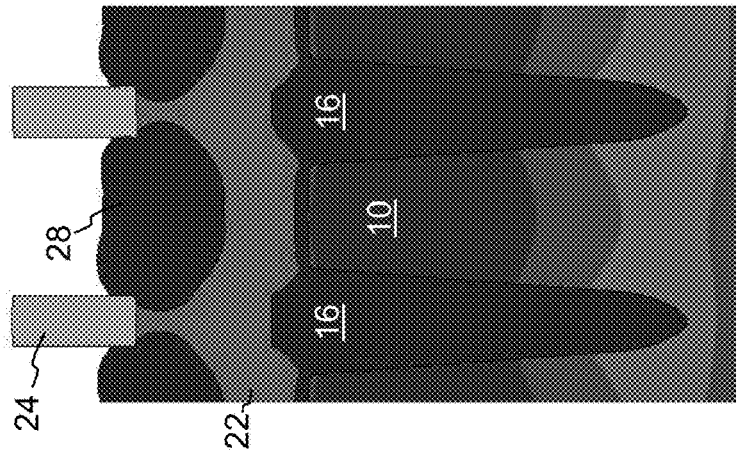
Figure 32C:
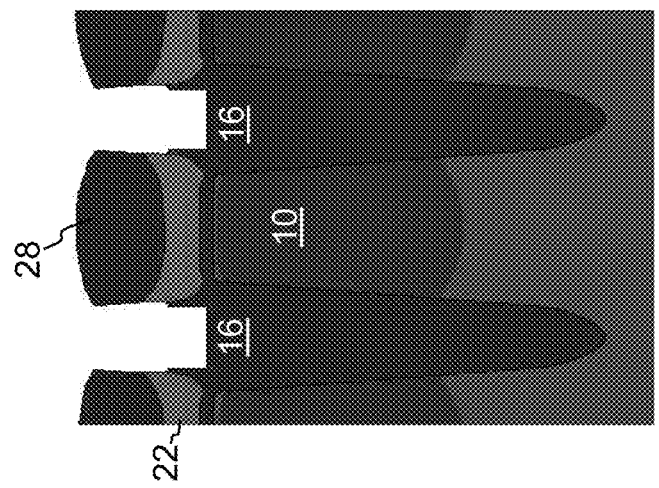
Figure 32B:
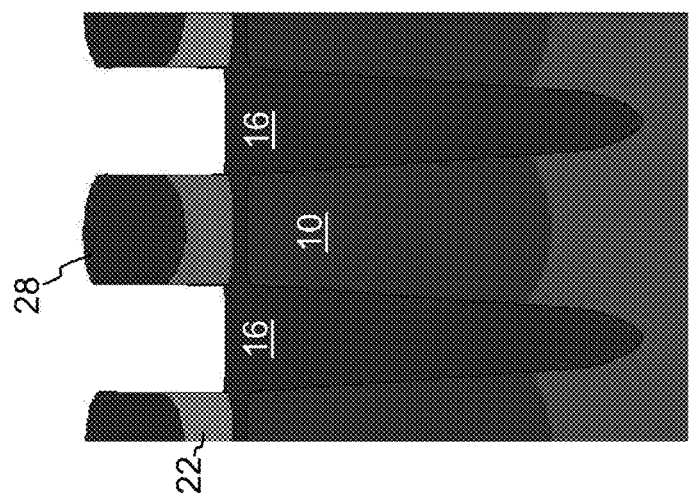
Figure 32A:
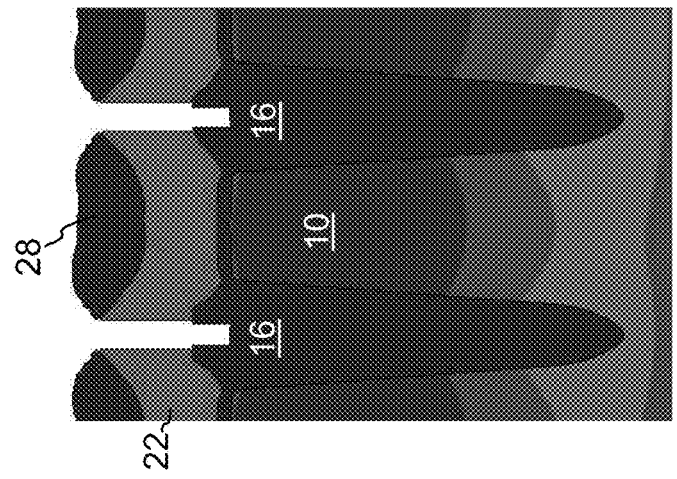
Figure 33C:
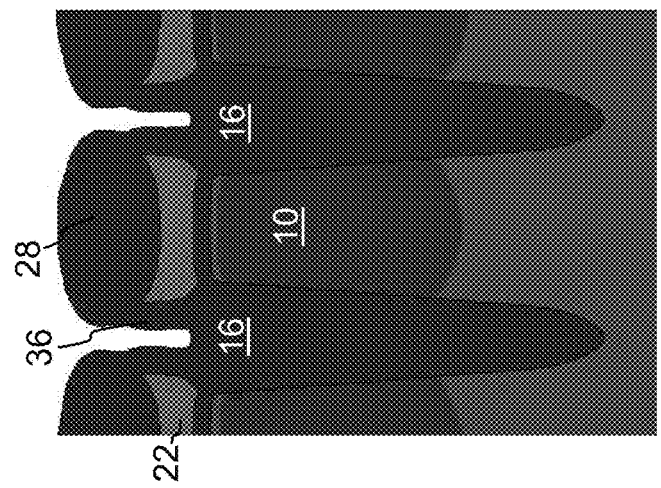
Figure 33B:
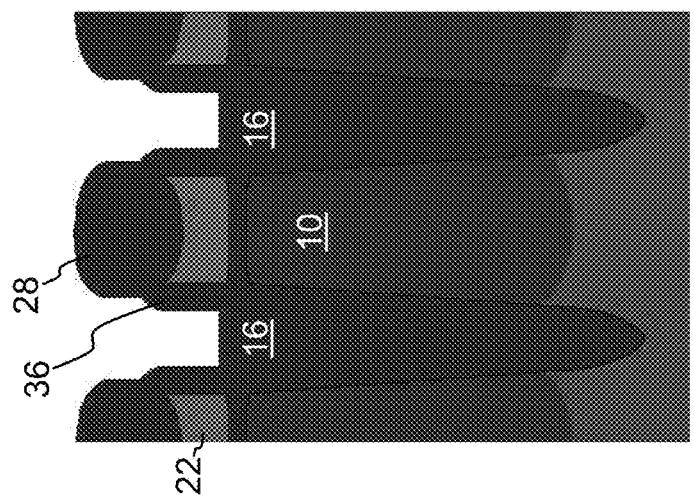
Figure 33A:
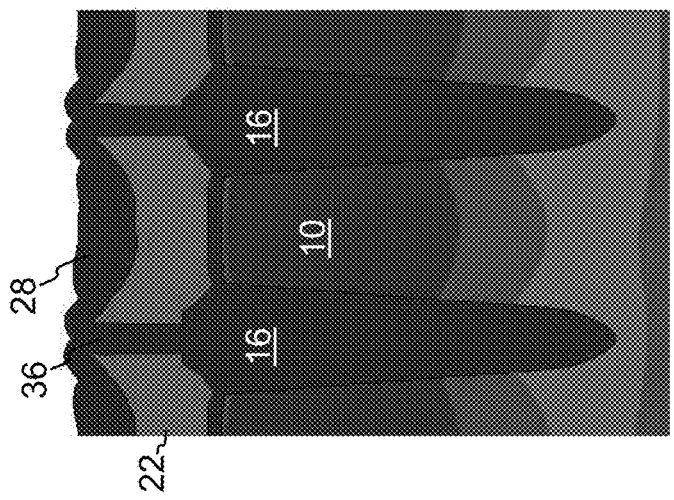

ILD 66, contact holes 68, bit line contacts 70 and bit lines 74 are formed as described above in the previous embodiment, resulting in the final structure shown in FIG. 29. The main different between the structure of FIG. 29 and that of FIG. 20A is that the word line gates are formed of metal 112 and WF metal layer 110, which are insulated from the substrate by capping layer 84 (if included), high K material layer 82 and interfacial layer 80.

Figure 34C:
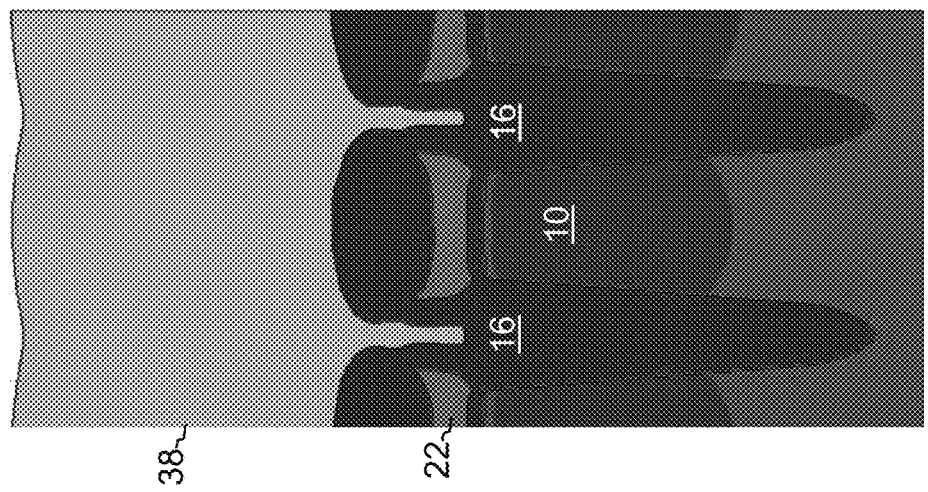
Figure 34B:
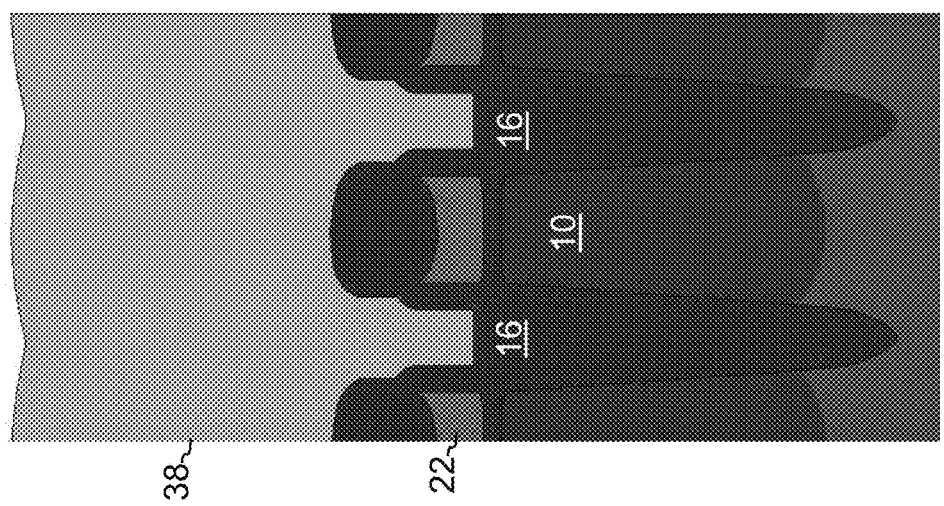
Figure 34A:
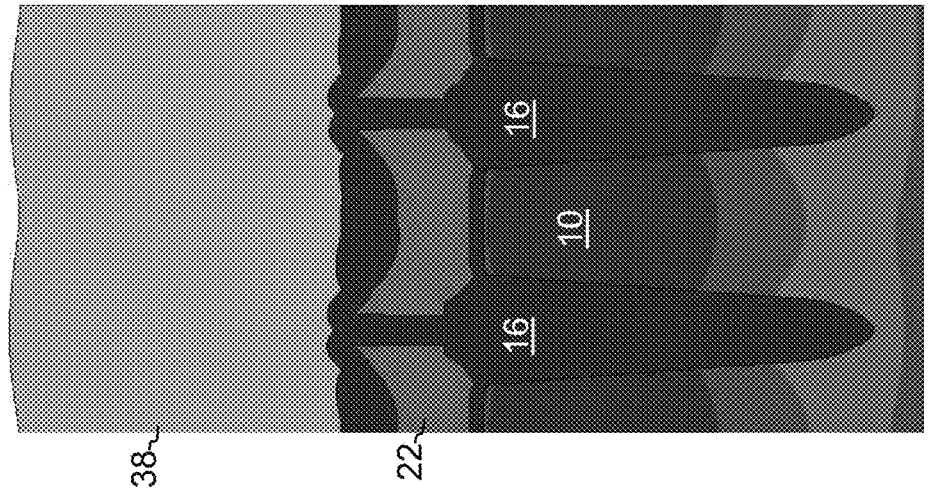

FIGS. 30A-34A show a lithographic technique for forming the floating gate 22, FIGS. 30B-34B show a self-aligned STI technique for forming the floating gate 22, and FIGS. 30C-34C show a CMP technique for forming the floating gate 22. For the lithographic technique, the heights of STI oxide 16 are reduced before the floating gate poly 22 is formed. Nitride 24 is formed over the poly 22, followed by photo resist 120, which is patterned using a masking step, and the underlying nitride 24 is etched away except for portions over the STI oxide 16, as shown in FIG. 30A. For the CMP technique, nitride 24 and a CMP etch are used to define the floating gate poly as discussed above with respect to FIG. 5B, and shown again in FIG. 30C. For the self-aligned STI technique, nitride 24 and a nitride etch back are used to define the floating gate as shown in FIG. 30B. For all three techniques, an oxidation process is used to oxidize the exposed portions of the floating gate poly 22 to form oxide 28, as shown in FIGS. 31A, 31B, 31C. Nitride and oxide etches (and a poly etch for the lithographic technique) are performed to remove nitride 24 (and poly 22 for the lithographic technique) and top portions of STI oxide 16, as shown in FIGS. 32A, 32B, 32C. The tunnel oxide 36 is then deposited on the structure, as shown in FIGS. 33A, 33B, 33C. The erase gate poly 38 is then deposited over the structure as shown in FIGS. 34A, 34B, 34C, which is followed by the remaining processing steps described above to complete the memory cell formation.

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a non-volatile memory cell comprising:
    forming, in a substrate of a first conductivity type, spaced apart first and second regions of a second conductivity type, defining a channel region there between;
    forming a floating gate disposed over and insulated from a first portion of the channel region and over a portion of the first region, wherein the floating gate includes a sharp edge disposed over the first region;
    forming a tunnel oxide layer around the sharp edge;
    forming an erase gate over and insulated from the first region, wherein the erase gate includes a notch facing the sharp edge, and wherein the notch is insulated from the sharp edge by the tunnel oxide layer; and
    forming a word line gate disposed over and insulated from a second portion of the channel region which is adjacent to the second region, wherein the forming of the word line gate is entirely performed after the forming of the tunnel oxide layer and the forming of the erase gate.

2. The method of claim 1, wherein the forming of the second region is performed after the forming of the word line gate.

3. The method of claim 1, wherein the forming of the word line gate includes:
   forming a high K insulation layer over the substrate; and
   forming a metal block over the high K insulation layer.

4. The method of claim 1, wherein the forming of the word line gate includes:
   forming a high K insulation layer over the substrate;
   forming a polysilicon block over the high K insulation layer; and
   removing and replacing the polysilicon block with a metal block.

5. The method of claim 1, wherein the forming of the word line gate includes:
   forming a conductive layer having a first portion disposed over and insulated from the second portion of the channel region, and a second portion disposed over and insulated from the erase gate; and
   removing the second portion of the conductive layer.

6. The method of claim 5, wherein the forming of the word line gate further includes:
   forming an insulation spacer over the first portion of the conductive layer; and
   removing a portion of the first portion of the conductive layer not disposed under the insulation spacer.

7. The method of claim 1, wherein the forming of the floating gate includes:
   forming a conductive layer over and insulated from the substrate;
   forming a block of insulation material on the conductive layer; and
   oxidizing an upper surface of the conductive layer leaving the upper surface sloping upwardly as the upper surface reaches the block of insulation material.

8. The method of claim 7, wherein the forming of the floating gate further includes:
   forming an insulation spacer along a sidewall of the erase gate and on the conductive layer; and
   performing an etch of the conductive layer adjacent the insulation spacer.

9. The method of claim 7, further comprising:
   forming a trench into the substrate; and
   filling the trench with first insulation material that extends out of the trench and above a surface of the substrate, wherein the forming of the trench and the filling of the trench are performed before the forming of the conductive layer.

10. The method of claim 9, wherein the forming of the floating gate further includes:
    performing a chemical mechanical polish on the upper surface of the conductive layer and an upper surface of the first insulation material before the oxidizing such that the upper surfaces of the conductive layer and the first insulation material are planar; and
    removing and replacing an upper portion of the first insulation material with second insulation material.

11. The method of claim 10, further comprising:
    etching away the second insulation material and an upper portion of the first insulation material after the oxidizing.

12. The method of claim 9, wherein the forming of the floating gate further includes:
    removing and replacing a portion of the conductive layer over the first insulation material with second insulation material before the oxidizing.

13. The method of claim 12, further comprising:
    etching away the second insulation material and an upper portion of the first insulation material after the oxidizing.

14. The method of claim 9, wherein the forming of the floating gate further includes:
    forming a block of insulation material on a portion of the conductive layer disposed over the first insulation material before the oxidizing.

15. The method of claim 14, further comprising:
    etching away the block of insulation material, a portion of the conductive layer over the first insulation material, and an upper portion of the first insulation material after the oxidizing.

* * * * *